(12) United States Patent
Kazlas et al.

(10) Patent No.: US 9,525,148 B2
(45) Date of Patent: Dec. 20, 2016

(54) DEVICE INCLUDING QUANTUM DOTS

(75) Inventors: Peter T. Kazlas, Sudbury, MA (US);
Zhaoqun Zhou, Allston, MA (US);
Yuhua Niu, Waltham, MA (US);
Sang-Jin Kim, Belmont, MA (US);
Benjamin S. Mashford, Essendon (AU)

(73) Assignee: QD VISION, INC., Lexington, MA (US)

( * ) Notice: Subject to any disclaimer, the term of this patent is extended or adjusted under 35 U.S.C. 154(b) by 0 days.

(21) Appl. No.: 13/441,394

(22) Filed: Apr. 6, 2012

(65) Prior Publication Data

US 2013/0009131 A1    Jan. 10, 2013

Related U.S. Application Data

(63) Continuation of application No. PCT/US2010/051867, filed on Oct. 7, 2010, which is
(Continued)

(51) Int. Cl.
*H01L 29/08* (2006.01)
*H01L 51/00* (2006.01)
(Continued)

(52) U.S. Cl.
CPC .............. *H01L 51/50* (2013.01); *B82Y 20/00* (2013.01); *H01L 51/502* (2013.01);
(Continued)

(58) Field of Classification Search
CPC .... H01L 51/50; H01L 51/502; H01L 51/5088; H01L 2251/552
(Continued)

(56) References Cited

U.S. PATENT DOCUMENTS

| 4,907,043 A | 3/1990 | Uekita et al. |
| 5,283,132 A | 2/1994 | Ogura et al. |

(Continued)

FOREIGN PATENT DOCUMENTS

| CN | 1245581 A1 | 2/2000 |
| CN | 1289525 A1 | 3/2001 |

(Continued)

OTHER PUBLICATIONS

Anikeeva et al., "Photoluminescence of CdSe/ZnS core/shell quantum dots enhanced by energy transfer from a phosphorescent donor", *Chem. Phys. Lett.*, vol. 424 (2006), pp. 120-125.
(Continued)

*Primary Examiner* — William D Coleman

(57) ABSTRACT

A device including an emissive material comprising quantum dots is disclosed. In one embodiment, the device includes a first electrode and a second electrode, a layer comprising quantum dots disposed between the first electrode and the second electrodes, and a first interfacial layer disposed at the interface between a surface of the layer comprising quantum dots and a first layer in the device. In certain embodiments, a second interfacial layer is optionally further disposed on the surface of the layer comprising quantum dots opposite to the first interfacial layer. In certain embodiments, a device comprises a light-emitting device. Other light emitting devices and methods are disclosed.

41 Claims, 1 Drawing Sheet

Related U.S. Application Data a continuation-in-part of application No. 12/896,856, filed on Oct. 2, 2010, which is a continuation-in-part of application No. PCT/US2009/002123, filed on Apr. 3, 2009.

(60) Provisional application No. 61/249,588, filed on Oct. 7, 2009, provisional application No. 61/042,154, filed on Apr. 3, 2008.

(51) Int. Cl.
  *H01L 51/50* (2006.01)
  *B82Y 20/00* (2011.01)

(52) U.S. Cl.
  CPC ...... *H01L 51/5048* (2013.01); *H01L 51/5088* (2013.01); *H01L 51/5072* (2013.01); *H01L 2251/5369* (2013.01); *H01L 2251/552* (2013.01)

(58) Field of Classification Search
  USPC .................................. 257/13, 40, E51.018
  See application file for complete search history.

(56) References Cited

U.S. PATENT DOCUMENTS

| | | | |
|---|---|---|---|
| 5,512,131 A | 4/1996 | Kumar et al. | |
| 5,537,000 A | 7/1996 | Alivisatos | |
| 5,663,573 A | 9/1997 | Epstein et al. | |
| 5,766,779 A | 6/1998 | Shi et al. | |
| 5,949,089 A | 9/1999 | Kim et al. | |
| 5,958,573 A | 9/1999 | Spitler et al. | |
| 5,981,092 A | 11/1999 | Arai et al. | |
| 6,023,073 A | 2/2000 | Strite | |
| 6,046,543 A | 4/2000 | Bulovic et al. | |
| 6,111,274 A | 8/2000 | Arai | |
| 6,157,047 A | 12/2000 | Fujita et al. | |
| 6,180,239 B1 | 1/2001 | Whitesides et al. | |
| 6,313,261 B1* | 11/2001 | Samuel et al. | 528/378 |
| 6,404,126 B1 | 6/2002 | Arai et al. | |
| 6,416,888 B1 | 7/2002 | Kawamura et al. | |
| 6,440,213 B1 | 8/2002 | Alivisatos et al. | |
| 6,518,168 B1 | 2/2003 | Clem et al. | |
| 6,656,608 B1* | 12/2003 | Kita et al. | 428/690 |
| 6,724,141 B2 | 4/2004 | Andriessen | |
| 6,797,412 B1 | 9/2004 | Jain et al. | |
| 6,838,816 B2 | 1/2005 | Su et al. | |
| 6,918,946 B2 | 7/2005 | Korgel et al. | |
| 6,955,856 B2 | 10/2005 | Lee et al. | |
| 7,160,613 B2 | 1/2007 | Bawendi et al. | |
| 7,199,393 B2 | 4/2007 | Park et al. | |
| 7,332,211 B1 | 2/2008 | Bulovic et al. | |
| 7,422,790 B1 | 9/2008 | Scher et al. | |
| 7,459,850 B2 | 12/2008 | Cok | |
| 7,491,642 B2 | 2/2009 | Lewis et al. | |
| 7,615,800 B2 | 11/2009 | Kahen et al. | |
| 7,700,200 B2 | 4/2010 | Bulovic et al. | |
| 7,777,233 B2* | 8/2010 | Kahen | C09K 11/025 257/21 |
| 7,910,400 B2 | 3/2011 | Kwon et al. | |
| 8,012,604 B2* | 9/2011 | Kathirgamanathan et al. | 428/690 |
| 8,080,437 B2 | 12/2011 | Steckel et al. | |
| 8,232,722 B2 | 7/2012 | Bawendi et al. | |
| 8,377,333 B2 | 2/2013 | Ramprasad et al. | |
| 8,404,154 B2 | 3/2013 | Breen et al. | |
| 8,535,758 B2 | 9/2013 | Bulovic et al. | |
| 8,563,143 B2 | 10/2013 | Park et al. | |
| 8,691,114 B2 | 4/2014 | Ramprasad et al. | |
| 2001/0052752 A1 | 12/2001 | Ghosh et al. | |
| 2002/0047551 A1 | 4/2002 | Rubner et al. | |
| 2002/0055040 A1 | 5/2002 | Mukherjee et al. | |
| 2002/0146590 A1 | 10/2002 | Matsuo et al. | |
| 2003/0042850 A1 | 3/2003 | Bertram et al. | |
| 2003/0059635 A1 | 3/2003 | Naasani | |
| 2003/0170927 A1 | 9/2003 | Holonyak et al. | |
| 2004/0000868 A1 | 1/2004 | Shimizu et al. | |
| 2004/0023010 A1 | 2/2004 | Bulovic et al. | |
| 2004/0178414 A1 | 9/2004 | Frey et al. | |
| 2004/0202875 A1 | 10/2004 | Yitzchaik | |
| 2004/0209115 A1 | 10/2004 | Thompson et al. | |
| 2005/0006656 A1 | 1/2005 | Jain et al. | |
| 2005/0014017 A1 | 1/2005 | Hosokawa et al. | |
| 2005/0051766 A1 | 3/2005 | Stokes et al. | |
| 2005/0116621 A1 | 6/2005 | Bellmann et al. | |
| 2005/0116633 A1 | 6/2005 | Yamazaki et al. | |
| 2005/0126628 A1 | 6/2005 | Scher et al. | |
| 2005/0189534 A1* | 9/2005 | Guyot-Sionnest et al. | 257/21 |
| 2005/0230673 A1 | 10/2005 | Mueller et al. | |
| 2005/0258418 A1 | 11/2005 | Steckel et al. | |
| 2005/0260440 A1 | 11/2005 | Seo et al. | |
| 2005/0274944 A1 | 12/2005 | Jang et al. | |
| 2006/0001066 A1 | 1/2006 | Ping et al. | |
| 2006/0043361 A1 | 3/2006 | Lee et al. | |
| 2006/0063029 A1 | 3/2006 | Jang et al. | |
| 2006/0105199 A1 | 5/2006 | Gerlach et al. | |
| 2006/0105200 A1 | 5/2006 | Poplavskyy et al. | |
| 2006/0196375 A1 | 9/2006 | Coe-Sullivan et al. | |
| 2006/0216759 A1 | 9/2006 | Naasani | |
| 2006/0232194 A1 | 10/2006 | Tung et al. | |
| 2006/0244358 A1 | 11/2006 | Kim et al. | |
| 2007/0001581 A1 | 1/2007 | Stasiak et al. | |
| 2007/0034856 A1 | 2/2007 | Ohsawa et al. | |
| 2007/0057263 A1 | 3/2007 | Kahen et al. | |
| 2007/0069202 A1 | 3/2007 | Choi et al. | |
| 2007/0087219 A1 | 4/2007 | Ren et al. | |
| 2007/0103068 A1 | 5/2007 | Bawendi et al. | |
| 2007/0170446 A1 | 7/2007 | Cho et al. | |
| 2007/0215856 A1 | 9/2007 | Kwon et al. | |
| 2007/0246734 A1 | 10/2007 | Lee et al. | |
| 2007/0257608 A1* | 11/2007 | Tyan et al. | 313/506 |
| 2008/0001167 A1 | 1/2008 | Coe-Sullivan et al. | |
| 2008/0041814 A1 | 2/2008 | Romano et al. | |
| 2008/0061683 A1* | 3/2008 | Bertram | 313/504 |
| 2008/0074050 A1 | 3/2008 | Chen et al. | |
| 2008/0087882 A1 | 4/2008 | LeCloux et al. | |
| 2008/0087899 A1* | 4/2008 | Sargent et al. | 257/80 |
| 2008/0142075 A1* | 6/2008 | Reddy et al. | 136/257 |
| 2008/0172197 A1 | 7/2008 | Skipor et al. | |
| 2008/0202383 A1 | 8/2008 | Shi | |
| 2008/0204366 A1 | 8/2008 | Kane et al. | |
| 2008/0216891 A1* | 9/2008 | Harkness et al. | 136/256 |
| 2008/0217602 A1 | 9/2008 | Kahen et al. | |
| 2008/0217608 A1* | 9/2008 | Suzuki et al. | 257/40 |
| 2008/0237612 A1 | 10/2008 | Cok | |
| 2008/0238829 A1 | 10/2008 | Kane et al. | |
| 2008/0278064 A1* | 11/2008 | Kumaki et al. | 313/504 |
| 2008/0278069 A1* | 11/2008 | Nishi et al. | 313/504 |
| 2008/0297028 A1 | 12/2008 | Kane et al. | |
| 2008/0297029 A1* | 12/2008 | Cok | 313/498 |
| 2008/0309234 A1* | 12/2008 | Cho et al. | 313/509 |
| 2009/0001349 A1 | 1/2009 | Kahen | |
| 2009/0001385 A1 | 1/2009 | Skipor et al. | |
| 2009/0001403 A1 | 1/2009 | Skipor et al. | |
| 2009/0002349 A1 | 1/2009 | Cok et al. | |
| 2009/0002806 A1 | 1/2009 | Skipor et al. | |
| 2009/0017268 A1 | 1/2009 | Skipor et al. | |
| 2009/0039764 A1 | 2/2009 | Cho et al. | |
| 2009/0059554 A1 | 3/2009 | Skipor et al. | |
| 2009/0066223 A1 | 3/2009 | Yabe et al. | |
| 2009/0087792 A1 | 4/2009 | Iizumi et al. | |
| 2009/0162011 A1 | 6/2009 | Coe-Sullivan et al. | |
| 2009/0181478 A1 | 7/2009 | Cox et al. | |
| 2009/0188558 A1 | 7/2009 | Jen et al. | |
| 2009/0215208 A1 | 8/2009 | Coe-Sullivan et al. | |
| 2009/0278141 A1 | 11/2009 | Coe-Sullivan et al. | |
| 2009/0283743 A1 | 11/2009 | Coe-Sullivan et al. | |
| 2009/0283778 A1 | 11/2009 | Coe-Sullivan et al. | |
| 2009/0320909 A1 | 12/2009 | Arango et al. | |
| 2010/0001256 A1 | 1/2010 | Coe-Sullivan et al. | |
| 2010/0012178 A1 | 1/2010 | Yang et al. | |
| 2010/0044635 A1 | 2/2010 | Breen et al. | |
| 2010/0044636 A1 | 2/2010 | Ramprasad et al. | |

(56) References Cited

U.S. PATENT DOCUMENTS

| | | |
|---|---|---|
| 2010/0051870 A1 | 3/2010 | Ramprasad |
| 2010/0051901 A1 | 3/2010 | Kazlas et al. |
| 2010/0052512 A1 | 3/2010 | Clough et al. |
| 2010/0132770 A1 | 6/2010 | Beatty et al. |
| 2010/0134520 A1 | 6/2010 | Coe-Sullivan et al. |
| 2010/0265307 A1 | 10/2010 | Linton et al. |
| 2010/0270511 A1 | 10/2010 | Locascio et al. |
| 2010/0283014 A1 | 11/2010 | Breen et al. |
| 2010/0314646 A1 | 12/2010 | Breen et al. |
| 2011/0025224 A1 | 2/2011 | Wood et al. |
| 2011/0080090 A1 | 4/2011 | Wood et al. |
| 2011/0095261 A1 | 4/2011 | Kazlas et al. |
| 2011/0101479 A1 | 5/2011 | Arango et al. |
| 2011/0140075 A1 | 6/2011 | Zhou et al. |
| 2011/0233483 A1 | 9/2011 | Breen et al. |
| 2011/0245533 A1 | 10/2011 | Breen et al. |
| 2011/0287566 A1 | 11/2011 | Jang et al. |
| 2012/0138894 A1 | 6/2012 | Qian et al. |
| 2012/0238047 A1 | 9/2012 | Bawendi et al. |
| 2012/0292594 A1 | 11/2012 | Zhou et al. |
| 2012/0292595 A1 | 11/2012 | Bawendi et al. |
| 2013/0037778 A1 | 2/2013 | Kazlas et al. |
| 2013/0221291 A1 | 8/2013 | Ramprasad et al. |
| 2013/0234109 A1 | 9/2013 | Breen et al. |

FOREIGN PATENT DOCUMENTS

| | | |
|---|---|---|
| CN | 1551697 A1 | 12/2004 |
| EP | 1843411 | 10/2007 |
| JP | A-2003-217861 | 7/2003 |
| JP | A-2004-296950 | 10/2004 |
| JP | A-2004-303592 | 10/2004 |
| JP | A-2005-038634 | 2/2005 |
| KR | 20060101184 | 9/2006 |
| KR | 20070013002 | 1/2007 |
| KR | 20100052926 A | 5/2010 |
| WO | WO-9828767 A1 | 7/1998 |
| WO | WO-03084292 A1 | 10/2003 |
| WO | WO-2006098540 A1 | 9/2006 |
| WO | WO-2007037882 A1 | 4/2007 |
| WO | WO-2007095173 | 8/2007 |
| WO | WO 2007/143197 A2 | 12/2007 |
| WO | WO 2007/143197 A3 | 12/2007 |
| WO | WO 2008/007124 A1 | 1/2008 |
| WO | WO 2008/063657 A2 | 5/2008 |
| WO | WO 2008/063657 A3 | 5/2008 |
| WO | WO-2008063652 | 5/2008 |
| WO | WO-2008073373 A1 | 6/2008 |
| WO | WO 2009/123763 A2 | 10/2009 |
| WO | WO 2009/123763 A3 | 10/2009 |
| WO | WO-2011005859 A2 | 1/2011 |
| WO | WO-2012138409 | 10/2012 |

OTHER PUBLICATIONS

Arango, A.C., "A Quantum Dot Heterojunction Photodetector" Submitted to the Department of Electrical Engineering and Computer Science, in partial fulfillment of the requirements for the degree of Masters of Science in Computer Science and Engineering at the Massachusetts Institute of Technology, Feb. 2005.

Blochwitz, et al., "Interface Electronic Structure of Organic Semiconductors With Controlled Doping Levels", Organic Electronics 2 (2001) 97-104.

Bolink, et al., "Efficient Polymer Light-Emitting Diode Using Air-Stable Metal Oxides as Electrodes", Adv. Mater. 20, pp. 1-4 (2008).

Carlson, et al., "Valence Band Alignment at Cadmium Selenide Quantum Dot and Zing Oxide (1010) Interfaces", J. Phys. Chem. C (2008), 112, pp. 8419-8423.

Carter, et al., "Enhanced luminance in polymer composite light emitting devices", Appl. Phys. Lett. 71 (9), (1997).

Chan et al., "Contact Potential Difference Measurements of Doped Organic Molecular Thin Films", J. Vac. Sci. Technol. A 22(4), Jul./Aug. 2004.

Coe-Sullivan et al., "Large-Area Ordered Quantum-Dot Monolayers via Phase Separation During Spin-Casting", Adv. Funct. Mater., vol. 15 (2005), pp. 1117-1124.

Coe-Sullivan et al., "Method for fabrication of saturated RGB quantum dot light emitting devices", Proc. of SPIE, vol. 5739 (2005), pp. 108-115.

Coe-Sullivan et al., "Turning the performance of hybrid organic/inorganic quantum dot light-emitting devices", Organic Electronics, vol. 4 (2003), pp. 123-130.

Coe-Sullivan, "Hybrid Organic/Quantum Dot Thin Film Structures and Devices", MIT Thesis in partial fulfillment of Ph.D. In Electrrical Engineering and Computer Science (2005).

Coe-Sullivan, et al., "Electroluminescence from single monolayers of nanocrystals in molecular organic devices", Nature, vol. 420, 19/26, Dec. 2002, pp. 800-803.

Final Office Action in copending U.S. Appl. No. 12/454,705, dated Aug. 27, 2013.

Search Report and Written Opinion for copending International application No. PCT/US2007/024310, dated May 27, 2008.

Search Report and Written Opinion for corresponding International application No. PCT/US2010/051867, dated Dec. 9, 2010.

Lin, et al., "Formation of Long-Range-Ordered Nanocrystal Superlattices on Silicon Nitride Substrates", J. Phys. Chem. B 105, pp. 3353-3357 (2001).

Lipovskii, et al., "Synthesis and characterization of PbSe quantum dots in phosphate glass", Appl. Phys. Lett 71 (23), (1997).

Luther, et al., "Analysis of a thin AlN interfacial layer in Ti/Al and Pd/Al ohmic contacts to $n$-type GaN", Appl. Phys. Lett. 71 (26), pp. 3859-3861 (1997).

Mashford, et al., "High-efficiency quantum-dot light-emitting devices with enhanced charge injection", Nature Photonics 7, pp. 407-412 (2013).

Moeller, et al., "Quantum-dot light-emitting devices for displays", Information Display, Feb. 2006, pp. 2-6.

Nayak, M. et al., (2008)"Passivation of CdTe Nanoparticles by Silane Coupling Agent Assisted Silica Encapsulation", in 26th Annual Conference on Composites, Advanced Ceramics, Materials, and Structures: B: Ceramic Engineering and Science Proceedings, vol. 23, Issue 4 (eds H.-T. Lin and M. Singh), John Wiley & Sons, Inc., Hoboken, NJ, USA.

Santhanam, et al., "Self-Assembly of Uniform Monolayer Arrays of Nanoparticles", Langmuir 19, pp. 7881-7887 (2003).

Schlamp, et al., "Improved efficiencies in light emitting diodes made with CdSe(CdS) core/shell type nanocrystals and a semiconducting polymer", J. Appl. Phys. 82 (11), pp. 5837-5842 (1997).

Schmechel, "A theoretical approach to the hopping transport in p-doped zinc-phthalocyanine" 48, Internationales Wissenschaftliches Kolloquium, Technische Universtaat Ilmenau, Sep. 22-25, 2003.

Huang, H. et al., :Bias-Induced Photoluminescence Quenching of Single Colloidal Quantum Dots Embedded in Organic Semiconductors, Nano Lett., 2007, 7 (12), 3781-3786.

Caruge, J.M. et al., "Colloidal Quantum-Dot Light-Emitting Diodes with Metal Oxide Charge Transport Layers", Nature Photonics, Apr. 2008, vol. 2, pp. 247-250.

Steckel, J.S., et al., "Blue Luminescence from (CdS)ZnS Core-Shell nanocrsytals", Angew. Chem. Int. Ed., 43: pp. 2154-2158 (2004).

NonFinal Office Action mailed Mar. 25, 2014 in copending U.S. Appl. No. 12/454,705 filed May 21, 2009.

NonFinal Office Action mailed Nov. 18, 2013 in copending U.S. Appl. No. 12/896,856 filed Oct. 2, 2010, of which the present application is a continuation-in-part.

Stouwdam, J.W., et al., "Red, green, and blue quantum dot LEDs with solution processable ZnO nanocrystal electron injection layers", 2008 Journal of Materials Chemistry, vol. 18, p. 1889-1894.

Ichikawa, et al., "Bipyridyl oxadiazoles as efficient and durable electron-transporting and hole-blocking molecular materials", J. Mater. Chem., 2006, 16, 221-25.

Action mailed Dec. 26, 2013, in Chinese Patent Application No. 200980120363.6, which is the Chinese counterpart of copending U.S. Appl. No. 12/896,856.

(56) References Cited

OTHER PUBLICATIONS

Office Action mailed Dec. 26, 2013, in Chinese patent application No. 200980120363.6. (English translation), which is the Chinese counterpart of copending U.S. Appl. No. 12/896,856.
Office Action mailed Jun. 3, 2013, in Chinese Patent Application No. 200980120363.6, which is the Chinese counterpart of copending U.S. Appl. No. 12/896,856.
Office Action mailed Jun. 3, 2013, in Chinese Patent Application No. 200980120363.6. (English translation), which is the Chinese counterpart of copending U.S. Appl. No. 12/896,856.
Office Action mailed Dec. 7, 2011, in Chinese Patent Application No. 200980120363.6, which is the Chinese counterpart of copending U.S. Appl. No. 12/896,856.
Office Action mailed Dec. 7, 2011, in Chinese Patent Application No. 200980120363.6. (English translation), which is the Chinese counterpart of copending U.S. Appl. No. 12/896,856.
Office Action mailed Oct. 30, 2012, in Chinese Patent Application No. 200980120363.6, which is the Chinese counterpart of copending U.S. Appl. No. 12/896,856.
Office Action mailed Oct. 30, 2012, in Chinese Patent Application No. 200980120363.6. (English translation), which is the Chinese counterpart of copending U.S. Appl. No. 12/896,856.
Office Action mailed Jul. 12, 2012, in European Patent Application No. 09727880.8, which is the European counterpart of the copending U.S. Appl. No. 12/896,856.
Supplemental Search Report mailed Jul. 22, 2011, in European Patent Application No. 09727880.8, which is the European counterpart of copending U.S. Appl. No. 12/896,856.
Bulovic, V. et al. "Transparent light-emitting devices" *Nature* 1996, vol. 380, p. 29.
Gu, G. et al. "Transparent organic light emitting devices" *Appl. Phys. Lett.* 1996, 68, pp. 2606-2608.
Dabbousi et al., "(CdSe)ZnS Core—Shell Quantum Dots: Synthesis and Characterization of a Size Series of Highly Luminescent Nanocrystallites", *J. Phys. Chem B.* 101, pp. 9463-9475 (1997).
Schmechel, R., "A theoretical approach to the hopping transport in p-doped zinc-phthalocyanine" 48, *Internationales Wissenschaftliches Kolloquium, Technische Universtaat Ilmenau*, Sep. 22-25, 2003.
Allen, et al., "Bulk transport measurements in ZnO: the effect of surface electron layers", *Phys. Rev. B* 81,075211 (2010).
Caruge, et al. "NiO as an inorganic hole-transporting layer in quantum-dot light-emitting devices", *Nano Lett* 6, pp. 2991-2994 (2006).
Chan, I.M. et al. "Improved performance of the single-layer and double-layer organic light emitting diodes by nickel oxide coated indium tin oxide anode" *Thin Solid Films*, 450 (2004) pp. 304-311.
Cherniayskaya, et al., "Photoionization of individual CdSe/CdS core/shell nanocrystals on silicon with 2-nm oxide depends on surface band bending", *Nano Lett.* 3, pp. 497-501 (2003).
Chittofrati, et al., "Uniform particles of zinc oxide of different morphologies", *Colloids and Surfaces* 48, pp. 65-78 (1990).
Coe-Sullivan, "Hybrid Organic/Quantum Dot Thin Film Structures and Devices", MIT Thesis in partial fulfillment of Ph.D. In Electrical Engineering and Computer Science (2005).
Coe-Sullivan, "The Application of Quantum Dots in Display Technology", Material Matters, vol, 2, No. 1, pp. 13-14 (Sigma-Aldrich 2007).
Office Action mailed Jul. 25, 2014, in Chinese Patent Application No. 200980120363.6, which is the Chinese counterpart of copending U.S. Appl. No. 12/896,856. (Chinese).
Office Action mailed Jul. 25, 2014, in Chinese Patent Application No. 200980120363.6, which is the Chinese counterpart of copending U.S. Appl. No. 12/896,856. (English translation).
Hoyer, et al., "Potential-Dependent Electron Injection in Nanoporous Colloidal ZnO Films", *J. Phys. Chem.*, (1995), vol. 99, pp. 14096-14100.
Lai, et al., "Stabilization of ZnO polar plane with charged surface nanodefects", Phys. Rev. B 82, 155406 (2010).

Lee; C., et al., "Full-color light-emitting diodes based on colloidal quantum dots", 218th ECS Meeting, Abstract #1590 (2010).
Lee; W.Y. et al., "High-current-density ITOx/NiOx thin-film diodes" Appl. Phys. Lett., vol. 72, Issue 13, pp. 1584 (1998).
Lee; Y.L. et al., "Highly Efficient Quantum-Dot Sensitized Solar Cell Based on Co-Sensitization of CdS/CdSe", Adv. Funct. Mater., vol. 19 (2009), pp. 604-609.
Li, et al., "Surface states in the photoionization of high-quality CdSe core/shell nanocrystals", ACS Nano 3, pp. 1267-1273 (2009).
Mashford, et al., "All-inorganic quantum-dot light-emitting devices formed via low-cost, wet-chemical processing", J. Mater. Chem. 20, 167-172 (2010).
Matijevic, "Preparation and characterization of monodispersed metal hydrous oxide sols", Progr. Colloid & Polymer Sci., vol. 61, pp. 24-35 (1976).
Miller, et al., "Microstructural evolution of sol-gel derived ZnO thin films", Thin Solid Films, vol. 518 (2010), pp 6792-6798.
Ohmori, et al., "Photovoltaic properties of phthalocyanine based p-n diode evaporated onto titanium dioxide", Thin Solid Films 2006, vol. 499, pp. 369-373.
Park; J.S., et al., "Efficient hybrid organic-inorganic light emitting diodes with self-assembled dipole molecule deposited metal oxides", Appl. Phys. Lett., vol. 96, (2010), pp. 243306(1-3).
Qian, L. et al. "Electroluminescence from light-emitting polymer/ ZnO nanoparticle heterojunctions at sub-bandgap voltages" Nano Today (2010) vol. 5, pp 384-389.
Sato, H. et al., "Transparent conducting p-type NiO thin films prepared by magnetron sputtering" Thin Solid Films, 236, 1-2 (1993).
Suga, K. et al., "Gas-sensing characteristics of ZnO-NiO junction structures with intervening ultrathin SiO2 layer" Sens. Actuators B , vol. 14, Issues 1-3, pp. 598-599 (1993).
Talapin, et al., "Prospects of colloidal nanocrystals for electronic and optoelectronic applications" Chem. Reviews, 2010, vol. 110, pp. 389-458.
Van Dijken, et al., "Influence of adsorbed oxygen on the emission properties of nanocrystalline ZnO particles", J. Phys. Chem. B 104, pp. 4355-4360 (2000).
Vogel, R., et al., "Quantum-Sized PbS, CdS, Ag2S, Sb2S2 and Bi2S3 Particles as Sensitizers for Various Nanoporous Wide-Bandgap Semiconductors", J. Phys. Chem., vol. 98 (1994), pp. 3183-3188.
Woo, et al., "Reversible charging of CdSe nanocrystals in a simple solid-state device", Adv. Mater. 14, pp. 1068-1071 (2002).
Wood, V. et al., "Selection of Metal Oxide Charge Transport Layers for Colloidal Quantum Dot LEDs", ACS Nano, 2009, 3 (11), pp. 3581-3586.
Wu, et al., "Charge-transfer processes in single CdSe/ZnS quantum dots with p-type NiO nanoparticles", Chem. Commun. 46, pp 4390-4392 (2010).
Yoshida, T. et al., "A New Near-Infrared-Light-Emitting Diode of Monodispersed Nanocrystallite Silicon"International Electron Devices Meeting 2001 (IEDM), Technical Digest, Washington, DC, Dec. 2-5, 2001, New York, NY: IEEE, US, Dec. 2, 2001, pp. 175-178.
Wood, V.; Caruge, J.M.; Halpert, J.E.; Bawendi, M.G.; Bulovic, V., "Efficient All-Inorganic Colloidal Quantum Dot LEDs," Lasers and Electro-Optics, 2007. CLEO 2007. Conference on , vol., No., pp. 1,2, 6-11 May 2007. (Optical Society of America, 2007), paper CMO1. See, in particular, Section 3.
Chinese Office Action issued Feb. 6, 2015 in Chinese Patent Application No., 2009801203636, which is the Chinese counterpart of copending U.S. Appl. No. 12/896,856, of which the present application is a continuation-in-part.
Chinese Office Action issued Jul. 17, 2015 in Chinese Patent Application No., 2009801203636, which is the Chinese counterpart of copending U.S. Appl. No. 12/896,856, of which the present application is a continuation-in-part.
Korean Notice of Preliminary Rejection mailed Feb. 3, 2015 in Korean Patent Application No., 10-2010-7024680, Which is the Korean counterpart of copending U.S. Appl. No. 12/896,856, of which the present application is a continuation-in-part.

(56) References Cited

OTHER PUBLICATIONS

U.S. Final Office Action mailed May 29, 2015 in U.S. Appl. No. 12/896,856, of which the present application is a continuation-in-part.
Preliminary Rejection mailed Jun. 29, 2016 in counterpart Korean Patent Application No. 10-2012-7011697. (The U.S. counterpart (U.S. 2008/0309234 of Cho et al.) of the Cited Reference, KR 10-2008-0110346, is already of record.).

* cited by examiner

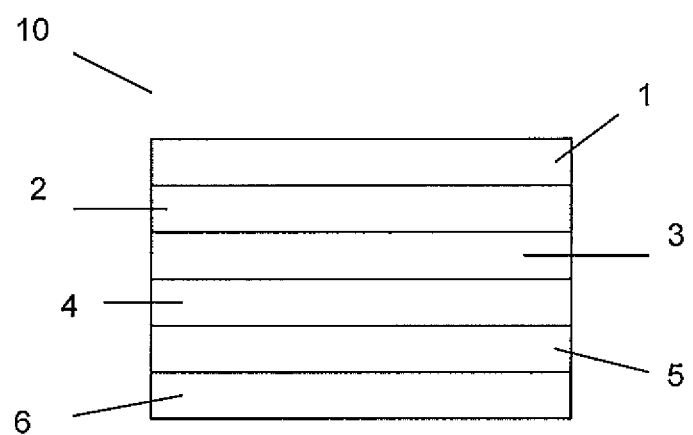

DEVICE INCLUDING QUANTUM DOTS

This application is a continuation of commonly owned International Application No. PCT/US2010/051867 filed 7 Oct. 2010, which was published in the English language as PCT Publication No. WO 2011/044391 A1 on 14 Apr. 2011, which International Application claims priority to U.S. Application No. 61/249,588 filed 7 Oct. 2009. Each of the foregoing is hereby incorporated herein by reference in its entirety.

International Application No. PCT/US2010/051867 is also a continuation-in-part of U.S. application Ser. No. 12/896,856 filed 2 Oct. 2010, which is a continuation of International Application No. PCT/US2009/002123 filed 3 Apr. 2009, which claims priority to U.S. Application No. 61/042,154 filed 3 Apr. 2008.

FEDERALLY SPONSORED RESEARCH OR DEVELOPMENT

This invention was made with Government support under Advanced Technology Program Award No. 70NANB7H7056 awarded by NIST and with Government support under Contract No. 2004*H838109*000 awarded by the Central Intelligence Agency. The United States has certain rights in the invention.

TECHNICAL FIELD OF THE INVENTION

The present invention relates to the technical field of devices including quantum dots.

SUMMARY OF THE INVENTION

In accordance with one aspect of the present invention there is provided a device including a first electrode and a second electrode, a layer comprising quantum dots disposed between the first electrode and the second electrode, and a first interfacial layer disposed at the interface between a surface of the layer comprising quantum dots and a first layer in the device.

Preferably, the first interfacial layer is a distinct layer.

In certain embodiments, the first layer can comprise a material capable of transporting charge, for example, a material capable of transporting holes, a material capable of transporting electrons, a material capable of transporting and injecting electrons, etc.

In certain embodiments, the first layer can comprise a material capable of injecting charge, for example, a material capable of injecting holes, a material capable of injecting electrons, etc.

In certain embodiments, the first layer can comprise a metal or other conductive material.

In certain embodiments, the first layer can comprise one or more separate layers.

In certain embodiments, the first layer can comprise one or more inorganic materials.

In certain embodiments, the first layer can comprise one or more organic materials.

In certain embodiments, a second interfacial layer can be disposed at the interface of the surface of the layer comprising quantum dots opposite the first interfacial layer and a second layer in the device. Preferably, the second interfacial layer is a distinct layer.

In certain embodiments, the second layer can comprise a material capable of transporting charge, for example, a material capable of transporting holes, a material capable of transporting electrons, a material capable of transporting and injecting electrons, etc.

In certain embodiments, the second layer can comprise a material capable of injecting charge, for example, a material capable of injecting holes, a material capable of injecting electrons, etc.

In certain embodiments, the second layer can comprise a metal or other conductive material.

In certain embodiments, the second layer can comprise one or more separate layers.

In certain embodiments, the second layer can comprise one or more inorganic material.

In certain embodiments, the second layer can comprise one or more organic materials.

An interfacial layer can comprise one or more separate layers.

An interfacial layer can comprise one or more inorganic materials.

An interfacial layer can comprise one or more organic materials.

An interfacial can fill voids that may exist between quantum dots.

An interfacial layer preferably can protect quantum dots from charge quenching sites in another device layer.

An interfacial layer can preferably protect quantum dots from charge quenching sites in a contiguous device layer.

An interfacial layer can comprise an adhesion promoting moiety. Examples of compounds including such moieties include, but are not limited to, surfactants.

An interfacial layer included in the devices and/or light emitting devices taught herein can comprise a surfactant (including but not limited to silicon-containing coupling agents). Examples include, but are not limited to, 1,4-bis (trimethoxysilylethyl)benzene, diphenyldiethoxysilane, other silane coupling agents including a phenyl group and/or a hydrolyzable alkoxy functional group. Other examples include, but are not limited to, surfactants or compounds that include functional groups such as amines, thiols, phosphonic acids, carboxylic acids, and other functional groups of the type typically included in ligands for quantum dots.

One example of a technique for forming an interfacial layer comprising a surfactant is a spin-coating technique. In certain of such embodiments, for example, the surfactant can be diluted with a volatilizable solvent (typically organic (e.g., hexane, etc.), spun onto the surface to be coated, and dried (e.g., baking in air at 100-150° C.). In embodiments that may include an interfacial layer comprising a surfactant, it may be desirable to apply the the surfactant in the thinnest possible thickness to minimize interference of electrial conductivity between the electron transport layer and the quantum dots.

An interfacial layer can comprise a metal oxide. Examples of metal oxides include metal oxides described elsewhere herein. In certain of such embodiments, an interfacial layer comprising a metal oxide comprises a separate layer added to the device (as opposed to a metal oxide formed by oxidation of a material in another layer of the device).

In certain embodiments, an interfacial layer can comprise a metal oxide including an alkali metal or alkaline earth metal dopant (such as lithium, sodium, potassium, cesium, magnesium, calcium, barium, etc.). In certain of such embodiments, the dopant level is about 10% or less, about 5% or less, about 2% or less, about 1% or less. In certain embodiments, a doped metal oxide can be formed by a sol-gel technique wherein the dopant is added by including a salt of the desired alkali metal or alkaline earth metal in the metal oxide precursor sol-gel mixture in an amount based on the desired dopant level for the doped metal oxide material.

An interfacial layer can comprise an organic small molecule material (e.g., but not limited to, OXD-7, LG101, S-2NPB, and other small molecule materials typically used in organic light emitting devices and/or quantum dot light emitting devices that include small molecule charge transport materials).

In certain embodiments, an interfacial layer can comprise organic small molecules that chemically stabilize the surface of the contiguous first or second layer, as the case may be.

In certain embodiments, an interfacial layer can comprise organic small molecules having a dipole moment that modifies the work function of the contiguous first or second layer, as the case may be.

Interfacial layers comprising organic small molecules can optionally be formed by phase separation of a mixture including quantum dots and the organic small molecule material.

Interfacial layers can be formed by a number of different techniques, including, but not limited to, spincasting, atomic layer deposition (ALD), molecular layer deposition (MLD), physical vapor deposition (e.g., evaporation, sputtering, electron beam evaporation), chemical vapor deposition (CVD), plasma-enhanced chemical vapor deposition (PECVD), contact printing, inkjet printing, self-assembly techniques, etc. Other suitable techniques can also be used.

In certain embodiments, an interfacial layer comprises a solution processible material. Solution processible materials are desirable and can be preferred for use in fabricating devices.

An interfacial layer preferably comprises a material non-quenching to quantum dot emission.

An interfacial layer can comprise a material that is non-crystallizing. For example, etystallizing of the material in the interfacial layer during device fabrication and device operation can be undesirable.

An interfacial layer can comprise a material with a glass transition temperature (Tg) greater than 150° C.

An interfacial layer can comprise a spiro compound.

An interfacial layer can comprise a conformal wide band gap material, such as, for example, but not limited to, metal oxides (e.g., aluminum oxide, hafnium oxide, etc.)

An interfacial layer can comprise non-light-emitting nanoparticles having a bandgap that is the same as or similar to the bandgap of quantum dots included in the active or emissive layer of the device comprising quantum dots. In certain embodiments, non-light-emitting nanoparticles can comprise non-emissive quantum dots.

An interfacial layer can comprise non-light-emitting nanoparticles having a bandgap that is higher than the bandgap of quantum dots included in the active or emissive layer of the device comprising quantum dots. In certain embodiments, non-light-emitting nanoparticles can comprise non-emissive quantum dots.

An interfacial layer included on the electron-injecting side of a device and/or light emitting device taught herein can preferably comprise non-light-emitting nanoparticles having a similar LUMO levels to quantum dots included in the active or emissive device layer including quantum dots.

An interfacial layer included on the electron-injecting side of a device and/or light emitting device taught herein can preferably comprise non-light-emitting nanoparticles having a similar HOMO levels to quantum dots included in the active or emissive device layer including quantum dots.

An interfacial layer can preferably comprise non-light-emitting semiconductor nanoparticles that have been chemically treated to give them intrinsic semiconductor properties.

An interfacial can comprise non-light-emitting semiconductor nanoparticles that have been chemically treated to give them n-type (electron transporting) semiconductor properties.

An interfacial layer can comprise non-light-emitting semiconductor nanoparticles that have been chemically treated to give them p-type (hole transporting) semiconductor properties.

An interfacial layer can comprise non-light-emitting nanoparticles that have been chemically treated to include a chemical linker capable of attaching to the emissive layer.

An interfacial layer can comprise an inorganic material that chemically stabilizes the surface of the first layer.

An interfacial layer included can comprise a bipolar transport material.

An interfacial layer can comprise an organometallic complex.

An interfacial layer can comprise a material with a weak dipole moment.

An interfacial layer can comprise a material with a strong dipole moment.

An interfacial layer can comprise a material with no dipole moment.

An interfacial layer can be attached to the layer comprising quantum dots and/or the first layer by an interfacial layer comprising linker molecules.

In a device including emissive quantum dots, an interfacial layer preferably has a thickness effective to reduce quenching of quantum dot emission due to interaction of the quantum dots with the first layer.

An interfacial layer preferably further has a thickness less than a thickness that would reduce charge transfer or tunneling between the layer comprising quantum dots and the first layer.

In certain embodiments, an interfacial layer can have a thickness ranging from a monolayer thickness to about 5 nm. In certain embodiments, an interfacial layer can have a thickness ranging from a monolayer thickness to about 10 nm. In certain embodiments, an interfacial layer can have a thickness ranging from a monolayer thickness to about 15 nm. In certain embodiments, an interfacial layer can have a thickness ranging from a monolayer thickness to about 20 nm. In certain embodiments, an interfacial layer can have a thickness ranging from a monolayer thickness to about 25 nm.

In certain embodiments, a monolayer thickness can have a thickness of approximately the diameter of a molecule included in the interfacial layer. In certain embodiments, the interfacial layer has a thickness up to about 10 monolayers. In certain embodiments, the interfacial layer has a thickness up to about 5 monolayers. In certain embodiments, the interfacial layer has a thickness up to about 3 monolayers. In certain embodiments, the interfacial layer has a thickness of about 2 monolayers. In certain embodiments, the interfacial layer has a thickness of about 1 monolayer.

Other thicknesses outside the above examples may also be determined to be useful or desirable.

The first interfacial layer can comprise an interfacial layer described herein.

The second interfacial layer, if included, can comprise an interfacial layer described herein.

In certain embodiments, the device comprises a light emitting device and the layer comprising quantum dots is an emissive layer.

In certain embodiments, the device comprises a light emitting device in accordance with embodiments of the invention taught herein.

In accordance with another aspect of the present invention, there is provided a light emitting device including a first electrode and a second electrode, an emissive layer comprising quantum dots disposed between the first and second electrodes, a first layer comprising a material capable of transporting charge disposed between the first electrode and the emissive layer, and a first interfacial layer disposed between the emissive layer and the first layer comprising a material capable of transporting charge.

Preferably the first interfacial layer is a distinct layer.

The first interfacial layer can comprise an interfacial layer described herein.

In certain embodiments, the first layer can comprise one or more separate layers.

In certain embodiments, the first layer can comprise a material capable of injecting and transporting charge.

A material capable of transporting charge (e.g., holes or electrons) can comprise an organic material.

Mixtures or blends of two or more organic materials can also be used.

A material capable of transporting charge (e.g., holes or electrons) preferably comprises an inorganic material.

Examples of such inorganic materials include, but are not limited to, metal chalcogenides. Examples of metal chalcogenides include, but are not limited to, metal oxides and metal sulfides.

One example of a preferred inorganic material capable of transporting charge comprises zinc oxide.

Mixtures or blends of two or more inorganic materials can also be used.

In certain embodiments, a material capable of transporting charge or a material capable of injecting and transporting charge can comprise a stratified structure including two or more horizontal zones or layers.

A light emitting device in accordance with the invention can further include a second layer comprising a material capable of transporting charge between the emissive layer and the second electrode.

The second layer comprising a material capable of transporting charge (e.g., holes or electrons) can comprise a material capable of transporting charge described herein.

In certain embodiments, the second layer can comprise one or more separate layers.

A light emitting device in accordance with the invention can further include a second interfacial layer between the emissive layer and the second layer comprising a material capable of transporting charge in the device. Preferably, the second interfacial layer is a distinct layer.

The second interfacial layer, if included, can comprise an interfacial layer described herein.

In certain embodiments, the first electrode comprises a cathode and the second electrode comprises an anode.

In certain embodiments, the first electrode comprises an anode and the second electrode comprises a cathode.

In certain embodiments, the first layer comprises a material capable of transporting electrons.

In certain embodiments, the material capable of transporting electrons is further capable of injecting electrons.

In certain embodiments, the first layer comprises a material capable of transporting holes.

In certain embodiments, the device further includes a second layer comprising a material capable of transporting charge between the emissive layer and the second electrode.

In certain embodiments, the second layer comprises a material capable of transporting holes. In certain of such embodiments, the first layer can comprise a material capable of transporting electrons. In certain embodiments, the material capable of transporting electrons is further capable of injecting electrons.

In certain embodiments, the second layer comprises a material capable of transporting electrons. In certain of such embodiments, the first layer can comprise a material capable of transporting holes.

In certain embodiments, the second layer comprises a material capable of transporting and injecting electrode electrons. In certain of such embodiments, the first layer can comprise a material capable of transporting holes.

In certain embodiments, one or more additional layers (e.g., but not limited to, charge injection, charge blocking, etc.) can be included in the device.

In certain embodiments, a light emitting device includes a first electrode and a second electrode, and an emissive layer comprising quantum dots provided between the electrodes, a first layer comprising material capable of transporting and injecting electrons provided between the first electrode and the emissive layer, a first interfacial layer between the emissive layer and layer comprising material capable of transporting and injecting electrons, a second layer comprising material capable of transporting holes provided between the emissive layer and the second electrode, and a layer comprising a hole-injection material provided between the second electrode and the layer comprising material capable of transporting holes. In certain preferred embodiments, the first electrode comprises a cathode and the second electrode comprises an anode.

In certain embodiments, the material capable of transporting electrons comprises an inorganic material.

In certain embodiments, the material capable of transporting electrons comprises an organic material.

In certain embodiments, the material capable of transporting electrons is further capable of injection electrons.

In certain embodiments, the material capable of transporting and injecting electrons comprises an inorganic material. In certain of such embodiments, such inorganic material is doped with a species to enhance electron transport characteristics of the inorganic material.

In certain embodiments, a material capable of transporting electrons comprises an inorganic semiconductor material.

In certain embodiments, a material capable of transporting and injecting electrons comprises an inorganic semiconductor material.

In certain embodiments, a material capable of transporting electrons comprises a metal chalcogenide. In certain embodiments, a material capable of transporting electrons comprises a metal sulfide. In certain preferred embodiments, a material capable of transporting electrons comprises a metal oxide.

In certain embodiments, a material capable of transporting and injecting electrons comprises a metal chalcogenide. In certain embodiments, a material capable of transporting and injecting electrons comprises a metal sulfide. In certain preferred embodiments, a material capable of transporting and injecting electrons comprises a metal oxide.

In certain embodiments, an inorganic material comprises an inorganic semiconductor material. Nonlimiting examples include metal chalcogenides (e.g., metal oxides, metal sulfides, etc.). In certain embodiments, an inorganic material comprises titanium dioxide. In certain more preferred embodiments, an inorganic material comprises zinc oxide.

In certain embodiments, an inorganic material comprises a mixture of two or more inorganic materials. In certain preferred embodiments, an inorganic material comprises a mixture of zinc oxide and titanium oxide.

In certain embodiments, a device includes the following layers formed in the following sequential order: the first electrode (preferably comprising a cathode), the first layer comprising a material capable of transporting electrons, a first interfacial layer, the emissive layer comprising quantum dots, the second layer comprising a material capable of transporting holes comprising, the layer comprising a hole injection material, and the second electrode (preferably comprising an anode).

In certain embodiments, a material capable of transporting electrons comprises an inorganic material. In certain of such embodiments, the inorganic material comprises an inorganic semiconductor material.

In certain embodiments, the layer comprising a material capable of transporting electrons (and preferably further capable of injecting electrons) can comprise a stratified structure including two or more horizontal zones having different conductivities. In certain embodiments, the stratified structure includes a first zone, on a side of the structure closer to the first electrode (preferably comprising a cathode), comprising an n-type doped material with electron injecting characteristics, and a second zone, on the side of the structure closer to the emissive layer, comprising an intrinsic or lightly doped material with electron transport characteristics. In certain embodiments, for example, the first zone can comprise n-type doped zinc oxide and the second zone can comprise intrinsic zinc oxide or n-type doped zinc oxide with a lower n-type dopant concentration that that of the zinc oxide in the first zone. In certain embodiments, for example, the stratified structure can include a first zone, on a side of the structure closer to the first electrode (preferably comprising a cathode), comprising an n-type doped material with electron injecting characteristics, a third zone, on a side of the structure closer to the emissive layer, comprising an intrinsic material with hole blocking characteristics, and a second zone, between the first and third zones, comprising an intrinsic or lightly doped material with electron transport characteristics. In certain embodiments, for example, a layer comprising a material capable of transporting and injecting electrons can comprise a first layer, closer to the first electrode (preferably comprising a cathode), comprising a material capable of injecting electrons and a second layer, closer to the emissive layer, comprising a material capable of transporting electrons. In certain embodiments, for example, a layer comprising a material capable of transporting and injecting electrons can comprise a first layer, closer to the cathode; a second layer, closer to the emissive layer, comprising a material capable of blocking holes; and a third layer between the first and second layers, comprising a material capable of transporting electrons.

In certain embodiments, the material capable of transporting holes can comprise an organic material.

In certain embodiments, the device can further include a second interfacial layer at the interface between the emissive layer and the second layer. Preferably, the second interfacial layer is a distinct layer.

In certain embodiments, a hole injection material can comprise a material capable of transporting holes that is p-type doped.

In certain embodiments, the absolute value of the difference between $E_{LUMO}$ of the quantum dots and the Work function of the Cathode is less than 0.5 eV. In certain embodiments, the absolute value of the difference between $E_{LUMO}$ of the quantum dots and the Work function of the Cathode is less than 0.3 eV. In certain embodiments, the absolute value of the difference between $E_{LUMO}$ of the quantum dots and the Work function of the Cathode is less than 0.2 eV.

In certain embodiments, the absolute value of the difference between $E_{LUMO}$ of the quantum dots and $E_{conduction\ band\ edge}$ of the material capable of transporting & injecting electrons is less than 0.5 eV. In certain embodiments, the absolute value of the difference between $E_{LUMO}$ Of the quantum dots and $E_{conduction\ band\ edge}$ of material capable of transporting & injecting electrons is less than 0.3 eV. In certain embodiments, the absolute value of the difference between $E_{LUMO}$ of the quantum dots and $E_{conduction\ band\ edge}$ of material capable of transporting & injecting electrons is less than 0.2 eV.

In certain embodiments, the absolute value of the difference between $E_{HOMO}$ of the quantum dots and the $E_{VALENCE\ band\ edge}$ of the material capable of transporting and injecting electrons is greater than about 1 eV. In certain embodiments, the absolute value of the difference between $E_{HOMO}$ of the quantum dots and the $E_{VALENCE\ band\ edge}$ of the material capable of transporting and injecting electrons is greater than about 0.5 eV. In certain embodiments, the absolute value of the difference between $E_{HOMO}$ of the quantum dots and the $E_{VALENCE\ band\ edge}$ of the material capable of transporting and injecting electrons is greater than about 0.3 eV.

In certain embodiments, an anode comprising a material with <5 eV work function can be used, thereby avoiding the need to utilize precious metals such as gold, etc.

In certain embodiments, the device can have an initial turn-on voltage that is not greater than 1240/λ, wherein λ represents the wavelength (nm) of light emitted by the emissive layer.

In certain embodiments, light emission from the light emissive material occurs at a bias across the device that is less than the electron-Volt of the bandgap of the quantum dots in the emissive layer.

An example of a preferred embodiment of a light emitting device in accordance with the present invention comprises a pair of electrodes, a layer comprising a light emissive material comprising quantum dots provided between the electrodes, a first layer comprising a material capable of transporting electrons provided between the emissive layer and one of the electrodes, and a first interfacial layer disposed at the interface between the emissive layer and the first layer comprising a material capable of transporting electrons, wherein the first layer comprising the material capable of transporting electrons comprising an inorganic material comprises a stratified structure including two or more horizontal zones having different conductivities. The inorganic material included in different zones of the stratified structure can be doped or undoped forms of the same or different materials.

In certain embodiments, the electron and hole populations are balanced at the emissive layer of the device.

In certain embodiments, the material capable of transporting electrons comprises an inorganic material.

In certain embodiments, the material capable of transporting electrons comprises a material that is further capable of injection electrons. In certain embodiments, such material comprises an inorganic material.

In certain embodiments, the inorganic material comprises an inorganic semiconductor material.

In certain preferred embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide.

In certain more preferred embodiments, the inorganic material comprises zinc oxide. In certain embodiments, the zinc oxide is surface treated with an oxidizing agent to render the surface proximate to the emissive layer intrinsic.

In certain embodiments, the inorganic material can comprise a mixture of two or more inorganic materials.

In certain embodiments, the layer comprising a stratified structure as taught herein can serve as a layer capable of transporting and injecting electrons. In certain embodiments, a zone in a layer comprising a stratified structure as taught herein can have a predetermined conductivity so as to serve as a layer capable of transporting electrons, a layer capable of injecting electrons, and/or a layer capable of blocking holes. In certain embodiments, a zone can comprise a distinct layer.

In certain embodiments, one or more additional layers taught herein can be included in the device.

In certain embodiments, a second interfacial layer can be included in the device on the surface of the emissive layer opposite the first interfacial layer. Preferably, the second interfacial layer is a distinct layer.

The first interfacial layer and the second interfacial layer (if included) can comprise an interfacial layer described herein.

In certain embodiments of the light emitting devices taught herein, the device has an initial turn-on voltage that is not greater than $1240/\lambda$, wherein $\lambda$ represents the wavelength (nm) of light emitted by the emissive layer.

In certain embodiments of a light emitting device in accordance with the present invention, light emission from the light emissive material occurs at a bias voltage across the device that is less than the energy in electron-Volts of the bandgap of the emissive material.

In certain embodiments, the light emitting device includes an emissive material comprising quantum dots. In certain embodiments, other well known light emissive materials can further be used or included in the device. In certain embodiments, additional layers can also be included.

In accordance with another aspect of the invention, there are provided displays and other products including the above-described light-emitting device.

In accordance with another aspect of the present invention, there is provided a method for preparing a device described herein, the method comprising:

forming a first electrode on a substrate;
forming a first layer thereover;
applying a first interfacial layer thereover;
applying a layer comprising quantum dots thereover; and
forming a second electrode thereover.

In certain embodiments, the method further comprises forming a second interfacial layer over the surface of the layer comprising quantum dots opposite the first interfacial layer. Preferably, the second interfacial layer is a distinct layer.

Examples of electrodes and interfacial layers are described herein.

In certain embodiments, other layers described herein can be included in the device.

In certain embodiment, the method further includes encapsulating the device.

In certain embodiments, the first electrode comprises a cathode and the second electrode comprises an anode.

In certain embodiments, the first electrode comprises an anode and the second electrode comprises a cathode.

In certain embodiments, the device comprises a light emitting device and the method comprises:

forming a first electrode on a substrate;
forming a first layer comprising a material capable of transporting charge thereover;
applying a first interfacial layer thereover;
applying an emissive layer comprising quantum dots thereover; and
forming second electrode thereover.

In certain embodiments, the method further comprises forming a second interfacial layer over the surface of the emissive layer opposite the first interfacial layer. Preferably, the second interfacial layer is a distinct layer.

Examples of interfacial layers are described herein.

In certain embodiments, other layers described herein can be included in the device.

In certain embodiments, the method further comprises encapsulating the light emitting device.

In certain embodiments, the first electrode comprises a cathode and the second electrode comprises an anode.

In certain embodiments, the first electrode comprises an anode and the second electrode comprises a cathode.

Quantum dots that can be included in a device or method taught herein can comprise quantum dots including a core comprising a first material and a shell disposed over at least a portion of, and preferably substantially all, of the outer surface of the core, the shell comprising a second material. (A quantum dot including a core and shell is also described herein as having a core/shell structure.) Optionally, more than one shell can be included on the core. The first material can preferably comprise an inorganic semiconductor material and the second material can preferably comprise an inorganic semiconductor material.

Preferably quantum dots comprise inorganic semiconductor nanocrystals. Such inorganic semiconductor nanocrystals preferably comprise a core/shell structure. In certain preferred embodiments, quantum dots comprise colloidally grown inorganic semiconductor nanocrystals.

Quantum dots typically can include a ligand attached to an outer surface thereof. In certain embodiments, two or more chemically distinct ligands can be attached to an outer surface of at least a portion of the quantum dots.

A layer including quantum dots that can be included in a device or method taught herein can include two or more different types of quantum dots, wherein each type is selected to emit light having a predetermined wavelength. In certain embodiments, quantum dot types can be different based on, for example, factors such composition, structure and/or size of the quantum dot.

Quantum dots can be selected to emit at any predetermined wavelength across the electromagnetic spectrum.

An emissive layer can include different types of quantum dots that have emissions at different wavelengths.

In certain embodiments, quantum dots can be capable of emitting visible light.

In certain embodiments, quantum dots can be capable of emitting infrared light.

As used herein, the terms "inorganic material" and "organic material" may be further defined by a functional descriptor, depending on the desired function being addressed. In certain embodiments, the same material can address more than one function.

In certain embodiments, it may be desirable to have different conductivities which can be accomplished, for example, by changing the carrier mobility and/or charge density of a material in a zone and/or layer.

In certain embodiments including a stratified structure, horizontal zones are preferably parallel to the electrodes.

Other aspects and embodiments of the invention relate to materials and methods that are useful in making the above described devices.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

BRIEF DESCRIPTION OF THE DRAWINGS

In the drawings:

FIG. 1 is schematic drawing depicting an example of an embodiment of a light-emitting device structure in accordance with the invention.

The attached figure is a simplified representation presented for purposes of illustration only; actual structures may differ in numerous respects, including, e.g., relative scale, etc.

For a better understanding to the present invention, together with other advantages and capabilities thereof, reference is made to the following disclosure and appended claims in connection with the above-described drawings.

DETAILED DESCRIPTION OF THE INVENTION

FIG. 1 provides a schematic representation of an example of the architecture of a light-emitting device according to one embodiment of the present invention. Referring to FIG. 1, the light-emitting device 10 includes (from top to bottom) a second electrode (e.g., an anode) 1, a second layer comprising a material capable of transporting charge (e.g., a material capable of transporting holes, which is also referred to herein as a "hole transport material") 2, an emissive layer including quantum dots 3, a first interfacial layer 4, a first layer comprising a material capable of transporting charge (e.g., a material capable of transporting electrons, a material capable of transporting and injecting electrons, such materials also being referred to herein as an "electron transport material") 5, a first electrode (e.g., a cathode) 6, and a substrate (not shown). In certain embodiments, a second interfacial layer is optionally further included between the emissive layer and the second layer. If included, a second interfacial layer is preferably a distinct layer.

In certain preferred embodiments, the electron transport material comprises an inorganic material.

In certain embodiments, the anode is proximate to and injects holes into the hole transport material while the cathode is proximate to and injects electrons into the electron transport material. The injected holes and injected electrons combine to form an exciton on the quantum dot and emit light. In certain embodiments, a hole injection layer is further included between the anode and the hole transport layer.

In certain preferred embodiments, an electron transport material is also capable of injecting electrons.

The substrate (not shown) can be opaque or transparent. A transparent substrate can be used, for example, in the manufacture of a transparent light emitting device. See, for example, Bulovic, V. et al., Nature 1996, 380, 29; and Gu, G. et al., Appl. Phys. Lett. 1996, 68, 2606-2608, each of which is incorporated by reference in its entirety. The substrate can be rigid or flexible. The substrate can be plastic, metal, semiconductor wafer, or glass. The substrate can be a substrate commonly used in the art. Preferably the substrate has a smooth surface. A substrate surface free of defects is particularly desirable.

The cathode 6 can be formed on the substrate (not shown). In certain embodiments, a cathode can comprise, ITO, aluminum, silver, gold, etc. The cathode preferably comprises a material with a work function chosen with regard to the quantum dots included in the device. In certain embodiments, the absolute value of the difference between $E_{LUMO}$ of the quantum dots and the work function of the cathode is less than about 0.5 eV. In certain embodiments the absolute value of the difference between $E_{LUMO}$ of the quantum dots and the work function of the cathode is less than about 0.3 eV, and preferably less than about 0.2 eV. $E_{LUMO}$ of the quantum dots represents the energy level of the lowest unoccupied molecular orbital (LUMO) of the quantum dot. For example, a cathode comprising indium tin oxide (ITO) can be preferred for use with an emissive material including quantum dots comprising a CdSe core/CdZnSe shell.

Substrates including patterned ITO are commercially available and can be used in making a device according to the present invention.

The layer comprising a material capable of transporting electrons 5 preferably comprises an inorganic material. Preferably the material capable of transporting electrons also is capable of injecting electrons. In certain embodiments, the inorganic material included in the layer capable or transporting and injection electrons comprises an inorganic semiconductor material. Preferred inorganic semiconductor materials include those having a band gap that is greater than the emission energy of the emissive material. In certain embodiments, the absolute value of the difference between $E_{LUMO}$ of the quantum dots and $E_{conduction\ band\ edge}$ of material capable of transporting and injecting electrons, is less than about 0.5 eV. In certain embodiments, the absolute value of the difference between $E_{LUMO}$ of the quantum dots and $E_{conduction\ band\ edge}$ of the material capable of transporting and injecting electrons, is less than about 0.3 eV, and preferably less than about 0.2 eV $E_{LUMO}$ of the quantum dots represents the energy level of the lowest unoccupied molecular orbital (LUMO) of the quantum dots; $E_{of\ the\ conduction\ band\ edge}$ of the material capable of transporting and injecting electrons represents the energy level of the conduction band edge of the material capable of transporting and injecting electrons.

Examples of inorganic semiconductor materials include a metal chalcogenide, a metal pnictide, or elemental semiconductor, such as a metal oxide, a metal sulfide, a metal selenide, a metal telluride, a metal nitride, a metal phosphide, a metal arsenide, or metal arsenide. For example, an inorganic semiconductor material can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, barium titanate, barium zirconate, zirconium silicate, yttria, silicon nitride, and a mixture of two or more thereof. In certain embodiments, the inorganic semiconductor material can include a dopant.

In certain preferred embodiments, an electron transport material can include an n-type dopant.

An example of a preferred inorganic semiconductor material for inclusion in an electron transport material of a device in accordance with the invention is zinc oxide. In certain embodiments, zinc oxide can be mixed or blended with one or more other inorganic materials, e.g., inorganic semiconductor materials, such as titanium oxide.

As mentioned above, in certain preferred embodiments, a layer comprising a material capable of transporting and injecting electrons can comprise zinc oxide. Such zinc oxide can be prepared, for example, by a sol-gel process. In certain embodiments, the zinc oxide can be chemically modified. Examples of chemical modification include treatment with hydrogen peroxide.

In other preferred embodiments, a layer comprising a material capable of transporting and injecting electrons can comprise a mixture including zinc oxide and titanium oxide.

The electron transport material is preferably included in the device as a layer. In certain embodiments, the layer has a thickness in a range from about 10 nm to 500 nm.

Electron transport materials comprising an inorganic semiconductor material can be deposited at a low temperature, for example, by a known method, such as a vacuum vapor deposition method, an ion-plating method, sputtering, inkjet printing, sol-gel, etc. For example, sputtering is typically performed by applying a high voltage across a low-pressure gas (for example, argon) to create a plasma of electrons and gas ions in a high-energy state. Energized plasma ions strike a target of the desired coating material, causing atoms from that target to be ejected with enough energy to travel to, and bond with, the substrate.

In certain embodiments, the layer comprising a material capable of transporting and injecting electrons can comprise a stratified structure comprising an inorganic material, wherein the stratified structure includes two or more horizontal zones having different conductivities. For example, in certain embodiments, the layer can include a first zone at the upper portion of the layer (nearer the emissive layer) comprising an intrinsic or slightly n-type doped inorganic material (e.g., sputtered intrinsic or slightly n-type doped zinc oxide) with electron transporting characteristics, and a second zone at the lower portion of the layer (more remote from the emissive layer) comprising inorganic material that has a higher concentration of n-type doping than the material in the first zone (e.g., sputtered n-type doped ZnO) with electron injection characteristics.

In another example, in certain embodiments, the layer can include three horizontal zones, e.g., a first zone at the upper portion of the layer (nearest the emissive layer) comprising an intrinsic inorganic material (e.g., sputtered intrinsic zinc oxide) which can be hole blocking; a second zone (between the first zone and the third zone) comprising an intrinsic or slightly n-type doped inorganic material (e.g., sputtered intrinsic or slightly n-type doped zinc oxide or another metal oxide) which can be electron transporting; and a third zone at the lowest portion of the layer (most remote from the emissive layer) comprising inorganic material that has a higher concentration of n-type doping than the material in the second zone (e.g., sputtered n-type doped ZnO or another metal oxide) which can be hole injecting.

In certain embodiments, the inorganic material included in the stratified structure comprises an inorganic semiconductor material. In certain preferred embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide. In certain more preferred embodiments, the inorganic material comprises zinc oxide. In certain embodiments, the inorganic material can comprise a mixture of two or more inorganic materials. Other inorganic materials taught herein for inclusion in a layer comprising a material capable of transporting and injecting electrons can also be included in a stratified structure.

Additional information concerning inorganic materials that may be useful for inclusion in an electron transport layer is disclosed in International Application No. PCT/US2006/005184, filed 15 Feb. 2006, for "Light Emitting Device Including Semiconductor Nanocrystals", which published as WO 2006/088877 on 26 Aug. 2006, the disclosure of which is hereby incorporated herein by reference in its entirety.

The surface of the device on which an inorganic semiconductor material is to be formed can be cooled or heated for temperature control during the growth process. The temperature can affect the crystallinity of the deposited material as well as how it interacts with the surface it is being deposited upon. The deposited material can be polycrystalline or amorphous. The deposited material can have crystalline domains with a size in the range of 10 Angstroms to 1 micrometer. If doped, the doping concentration can be controlled by, for example, varying the gas, or mixture of gases, with a sputtering plasma technique. The nature and extent of doping can influence the conductivity of the deposited film, as well as its ability to optically quench neighboring excitons.

In certain embodiments, a material capable of transporting electrons can comprise an organic material. Information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, each of which is hereby incorporated herein by reference in its entirety. Other organic electron transport materials can be readily identified by one of ordinary skill in the relevant art.

In the example shown in FIG. 1, the first interfacial layer is disposed between the first layer 5 and the emissive layer 3. The inclusion of the first interfacial layer between the first layer and emissive layer can preferably reduce the photoluminescent quenching of quantum dots while not impeding charge flow.

An interfacial layer can comprise an inorganic material.

An interfacial layer can comprise one or more inorganic materials.

An interfacial layer can comprise an organic material.

An interfacial layer can comprise one or more organic materials.

An interfacial layer can comprise one or more separate layers.

In certain embodiments, the interfacial layer can fill voids that may exist between quantum dots.

In certain preferred embodiments, the interfacial layer can protect quantum dots from charge quenching sites in another device layer. Quenching sites can include, for example, but are not limited to, degraded organic molecules included, e.g., in a device layer, high conductivity materials that may be included in charge injection device layers, dangling bonds that may occur in, e.g., inorganic charge transport materials (e.g., metal oxides).

An interfacial layer included in the devices and/or light emitting devices taught herein can comprise an adhesion promoting moiety. Examples of compounds including such moieties include, but are not limited to, surfactants.

In certain embodiments, an interfacial layer comprises a surfactant (including but not limited to silicon-containing coupling agents). Examples include, but are not limited to, 1,4-bis(trimethoxysilylethyl)benzene, diphenyldiethoxysilane, other silane coupling agents including a phenyl group and/or a hydrolyzable alkoxy functional group. Other examples include, but are not limited to, surfactants or compounds that include functional groups such as amines, thiols, phosphonic acids, carboxylic acids, and other functional groups of the type typically included in ligands for quantum dots.

In certain embodiments in which an interfacial layer comprising a surfactant is included between an electron transport material and a layer including quantum dots, the surfactant is applied with the thinnest possible thickness to minimize interference of electrial conductivity between the electron transport layer and the quantum dots.

One example of a technique for forming an interfacial layer comprising a surfactant is a spin-coating technique. In certain of such embodiments, for example, the surfactant can be diluted with a volatilizable solvent (typically organic (e.g., hexane, etc.), spun onto the surface to be coated, and dried (e.g., baking in air at 100-150° C.).

In certain embodiments, an interfacial layer comprises a metal oxide. Examples of metal oxides include wide band gap metal oxide materials (e.g., aluminum oxide, hafnium oxide, etc.) and other metal oxides described elsewhere herein.

In certain embodiments, an interfacial layer comprises a metal oxide including an alkali metal or alkaline earth metal dopant (such as lithium, sodium, potassium, cesium, magnesium, calcium, barium, etc.). In certain of such embodiments, the dopant level is about 10% or less, about 5% or less, about 2% or less, about 1% or less. In certain embodiments, a doped metal oxide can be formed by a sol-gel technique wherein the dopant is added by including a salt of the desired alkali metal or alkaline earth metal in the metal oxide precursor sol-gel mixture in an amount based on the desired dopant level for the doped metal oxide material.

In certain embodiments, an interfacial layer comprises an organic small molecule material (e.g., but not limited to, OXD-7, LG101, S-2NP13, and other small molecule materials typically used in organic light emitting devices and/or quantum dot light emitting devices that include small molecule charge transport materials).

An interfacial layer included in the devices and/or light emitting devices taught herein can comprise organic small molecules that chemically stabilize the surface of the contiguous first or second layer, as the case may be.

An interfacial layer included in the devices and/or light emitting devices taught herein can comprise organic small molecules having a dipole moment that modifies the work function of the contiguous first or second layer, as the case may be.

Interfacial layers can optionally be formed by phase separation of a mixture including quantum dots and organic small molecule material.

Interfacial layers can be formed by a number of different techniques, including, but not limited to, spincasting, atomic layer deposition (ALD), physical vapor deposition (e.g., evaporation, sputtering, electron beam evaporation), molecular layer deposition (MLD), chemical vapor deposition (CVD), plasma-enhanced chemical vapor deposition (PECVD), contact printing, inkjet printing, self-assembly techniques, etc. Such techniques are known. Other suitable techniques can also be used.

In certain embodiments, the interfacial layer comprises a solution processible material. Solution processible materials are desirable and can be preferred for use in fabricating devices.

In certain preferred embodiments, an interfacial layer comprises a material non-quenching to quantum dot emission.

In certain embodiments, an interfacial layer comprises a material that is non-crystallizing. For example, crystallizing of the material in the interfacial layer during device fabrication and device operation can be undesirable.

In certain embodiments, an interfacial layer comprises material with a glass transition temperature (Tg) greater than 150° C.

In certain embodiments, an interfacial layer comprises a spiro compound.

An interfacial layer included in the devices and/or light emitting devices taught herein can comprise a conformal wide band gap material, such as, for example, but not limited to, metal oxides (e.g., aluminum oxide, hafnium oxide, etc.)

An interfacial layer included in light emitting devices taught herein can preferably comprise non-light-emitting nanoparticles having a bandgap that is the same or similar to the bandgap of quantum dots included in the emissive layer. Examples of such nanoparticles include, but are not limited to, nanoparticles comprising CdSe, CdS, ZnSe, CdTe, or ZnTe.

An interfacial layer included in light emitting devices taught herein can preferably comprise non-light-emitting nanoparticles having a bandgap that is higher than the bandgap of quantum dots included in the emissive layer. Examples of such nanoparticles include, but are not limited to, nanoparticles comprising ZnO, $TiO_2$, ZnS, $CuAlO_2$, $WO_3$, $ZrO_2$, or associated alloys.

An interfacial layer included on the electron-injecting side of a device and/or light emitting device taught herein can preferably comprise non-light-emitting nanoparticles having a similar LUMO levels to quantum dots included in the active or emissive device layer including quantum dots.

An interfacial layer included on the electron-injecting side of a device and/or light emitting device taught herein can preferably comprise non-light-emitting nanoparticles having a similar HOMO levels to quantum dots included in the active or emissive device layer including quantum dots.

An interfacial layer included in the devices and/or light emitting devices taught herein can preferably comprise non-light-emitting semiconductor nanoparticles that have been chemically treated to give them intrinsic semiconductor properties.

In embodiments in which an interfacial layer comprises nanoparticles (e.g., semiconductor nanoparticles, quantum dots, semiconductor nanocrystals, etc.), such nanoparticles can further include ligand groups attached thereto which are chemically or physically distinguishable from those that may be attached to quantum dots included in the device layer comprising quantum dots. By way of non-limiting example, if the quantum dots included in the device layer have long chain ligands attached thereto, the nanoparticles included in an interfacial layer can include short chain ligands attached thereto. Selection of ligands based on this teaching is within the skill of the person of ordinary skill in the relevant art.

An interfacial layer included in the devices and/or light emitting devices taught herein can comprise non-light-emitting semiconductor nanoparticles that have been chemically treated to give them n-type (electron transporting) semiconductor properties.

An interfacial layer included in the devices and/or light emitting devices taught herein can comprise non-light-emitting semiconductor nanoparticles that have been chemically treated to give them p-type (hole transporting) semiconductor properties.

Examples of chemical treatments include, but are not limited to, in situ ligand exchange. Chemical treatments could alternatively or additionally be performed at the synthesis stage. Examples of synthesis-stage processing include, but are not limited to, solution-phase ligand exchange or incorporation of dopant during nanocrystal growth.

An interfacial layer included in the devices and/or light emitting devices taught herein can comprise non-light-emitting nanoparticles that have been chemically treated to include a chemical linker capable of attaching to the emissive layer. Examples of chemical linkers include, but are not limited to, compounds including functional groups such as amines, thiols, phosphonic acids, carboxylic acids, and other functional groups of the type typically included in ligands for quantum dots.

An interfacial layer included in the devices and/or light emitting devices taught herein can comprise an inorganic material that chemically stabilizes the surface of the first layer.

An interfacial layer included in the devices and/or light emitting devices taught herein can comprise a bipolar transport material.

An interfacial layer included can comprise an organometallic complex.

An interfacial layer included can comprise a material with a weak dipole moment.

An interfacial layer included can comprise a material with a strong dipole moment.

An interfacial layer included can comprise a material with no dipole moment.

An interfacial layer can be attached to the layer comprising quantum dots and/or the first layer by an interfacial layer comprising linker molecules.

An interfacial layer is preferably a distinct layer (e.g., a layer comprising a material that is physically or chemically distinguishable from a contiguous device layer or a separate layer as opposed to a doped region of contiguous layer).

In certain embodiments, the interfacial layer has a thickness effective to prevent charge quenching of quantum dots due to interaction of the quantum dots in the device layer comprising quantum dots with another layer or material which would be contiguous thereto if the interfacial layer were not disposed therebetween. Preferably, the thickness of the interfacial layer is also selected to not prevent charge transfer or tunneling between the emissive layer and such layer.

In a light emitting device, the interfacial layer preferably has a thickness effective to prevent charge quenching of quantum dot emission due to interaction of the quantum dots in the emissive with another layer or material which would be contiguous thereto if the interfacial layer were not disposed therebetween. Preferably, the thickness of the interfacial layer is also selected to not prevent charge transfer or tunneling between the emissive layer and such layer.

In certain embodiments, an interfacial layer can have a thickness ranging from a monolayer thickness to about 5 nm. In certain embodiments, an interfacial layer can have a thickness ranging from a monolayer thickness to about 10 nm. In certain embodiments, an interfacial layer can have a thickness ranging from a monolayer thickness to about 15 nm. In certain embodiments, an interfacial layer can have a thickness ranging from a monolayer thickness to about 20 nm. In certain embodiments, an interfacial layer can have a thickness ranging from a monolayer thickness to about 25 nm. In certain embodiments, a monolayer thickness can have a thickness of approximately the diameter of a molecule included in the layer. Other thicknesses outside the above examples may also be determined to be useful or desirable.

In certain embodiments, an interfacial layer can promote better electrical interface between the emissive layer and the layer of the device on the other side of the interfacial layer.

The emissive material 4 includes quantum dots. In certain embodiments, the quantum dots comprise an inorganic semiconductor material. In certain preferred embodiments, the quantum dots comprise crystalline inorganic semiconductor material (also referred to as semiconductor nanocrystals). Examples of preferred inorganic semiconductor materials include, but are not limited to, Group II-VI compound semiconductor nanocrystals, such as CdS, CdSe, ZnS, ZnSe, ZnTe, HgS, HgSe, HgTe, and other binary, ternary, and quaternary II-VI compositions; Group III-V compound semiconductor nanocrystals, such as GaP, GaAs, InP and InAs; PbS; PbSe; PbTe, and other binary, ternary, and quaternary III-V compositions. Other non-limiting examples of inorganic semiconductor materials include Group II-V compounds, Group III-VI compounds, Group IV-VI compounds, Group I-III-VI compounds, Group II-IV-VI compounds, Group II-IV-V compounds, Group IV elements, an alloy including any of the foregoing, and/or a mixture including any of the foregoing. Further, materials for the quantum dot light-emitting layer may be core-shell structured nanocrystals (for example, CdSe/ZnS, CdS/ZnSe, InP/ZnS, etc.) wherein the core is composed of a semiconductor nanocrystal (e.g. CdSe, CdS, etc.) and the shell is composed of a crystalline inorganic semiconductor material (e.g., ZnS, ZnSe, etc.).

Quantum dots can also have various shapes, including, but not limited to, sphere, rod, disk, other shapes, and mixtures of various shaped particles.

An emissive material can comprise one or more different quantum dots. The differences can be based, for example, on different composition, different size, different structure, or other distinguishing characteristic or property.

The color of the light output of a light-emitting device can be controlled by the selection of the composition, structure, and size of the quantum dots included in a light-emitting device as the emissive material.

The emissive material is preferably included in the device as a layer. In certain embodiments, the emissive layer can comprise one or more layers of the same or different emissive material(s). In certain embodiments, the emissive layer can have a thickness in a range from about 1 nm to about 20 nm. In certain embodiments, the emissive layer can have a thickness in a range from about 1 nm to about 10 nm. In certain embodiments, the emissive layer can have a thickness in a range from about 3 nm to about 6 about nm. In certain embodiments, the emissive layer can have a thickness of about 4 nm. A thickness of 4 nm can be preferred in a device including an electron transport material including a metal oxide. Other thicknesses outside the above examples may also be determined to be useful or desirable.

Preferably, the quantum dots include one or more ligands attached to the surface thereof. In certain embodiments, a ligand can include an alkyl (e.g., $C_1$-$C_{20}$) species. In certain embodiments, an alkyl species can be straight-chain, branched, or cyclic. In certain embodiments, an alkyl species can be substituted or unsubstituted. In certain embodiments, an alkyl species can include a hetero-atom in the chain or cyclic species. In certain embodiments, a ligand can include an aromatic species. In certain embodiments, an aromatic species can be substituted or unsubstituted. In certain embodiments, an aromatic species can include a hetero-atom. Additional information concerning ligands is provided herein and in various of the below-listed documents which are incorporated herein by reference.

By controlling the structure, shape and size of quantum dots during preparation, energy levels over a very broad range of wavelengths can be obtained while the properties of the bulky materials are varied. Quantum dots (including but not limited to semiconductor nanocrystals) can be prepared by known techniques. Preferably they are prepared by a wet chemistry technique wherein a precursor material is added to a coordinating or non-coordinating solvent (typically organic) and nanocrystals are grown so as to have an intended size. According to the wet chemistry technique, when a coordinating solvent is used, as the quantum dots are grown, the organic solvent is naturally coordinated to the surface of the quantum dots, acting as a dispersant. Accordingly, the organic solvent allows the quantum dots to grow to the nanometer-scale level. The wet chemistry technique has an advantage in that quantum dots of a variety of sizes can be uniformly prepared by appropriately controlling the concentration of precursors used, the kind of organic solvents, and preparation temperature and time, etc.

A coordinating solvent can help control the growth of quantum dots. The coordinating solvent is a compound having a donor lone pair that, for example, has a lone electron pair available to coordinate to a surface of the growing quantum dots. Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for quantum dot production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl) amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, and hexyl octanoate. In certain embodiments, technical grade TOPO can be used.

Quantum dots can alternatively be prepared with use of non-coordinating solvent(s).

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of quantum dots can be further refined by size selective precipitation with a poor solvent for the quantum dots, such as methanol butanol as described in U.S. Pat. No. 6,322,901. For example, semiconductor nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot population preferably has no more than a 15% rms deviation from mean diameter, more preferably 10% rms deviation or less, and most preferably 5% rms deviation or less.

In certain embodiments, quantum dots preferably have ligands attached thereto.

In certain embodiment, the ligands can be derived from the coordinating solvent used during the growth process.

In certain embodiments, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

More specifically, the coordinating ligand can have the formula:

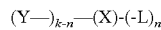

wherein k is 2, 3 4, or 5, and n is 1, 2, 3, 4 or 5 such that k-n is not less than zero; X is O, O—S, O—Se, O—N, O—P, O—As, S, S=O, $SO_2$, Se, Se=O, N, N—O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry.

Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated herein by reference in its entirety.

Other examples of ligands include benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, or a mixture of the foregoing. In certain embodiments, a ligand comprises 3, 5-di-tert-butyl-4-hydroxybenzylphosphonic acid, a conjugate base of the acid, or a mixture of the foregoing.

Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", each of the foregoing being hereby incorporated herein by reference.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both.

For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, and no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWI-IM of semiconductor nanocrystals can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of semiconductor nanocrystals will emit light spanning a narrow range of wavelengths. A pattern including more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Seherrer equation. It also can be estimated from the UV/V is absorption spectrum.

An emissive material can be deposited by spin-casting, screen-printing, inkjet printing, gravure printing, roll coating, drop-casting, Langmuir-Blodgett techniques, contact printing or other techniques known or readily identified by one skilled in the relevant aft.

In certain preferred embodiments, an emissive layer comprising quantum dots (which quantum dots may further include ligands attached thereto) included in a light emitting device (or an active layer comprising quantum dots (which quantum dots may further include ligands attached thereto) included in a non-light emitting device) described herein includes quantum dots that are not dispersed in a host matrix.

In certain preferred embodiments, after the emissive material is deposited, it is exposed to small molecules and/or light prior to forming another device layer thereover. Examples of small molecules include a molecule with a molecular weight of less than 100 a.m.u., e.g., water. Small polar molecules can be preferred. A small molecule can be in the form of a gas, a liquid dispersed in carrier gas (e.g., a mist, vapor, spray, etc.), a liquid, and/or a mixture thereof. Mixtures including small molecules having different compositions can also be used. A small molecule can include a lone electron pair. Such exposure to small molecules and/or light can be carried out in air or in the absence or substantial absence of oxygen. Exposure to small molecules and/or light can be carried out at a temperature in a range from about 20° to about 80° C. When carried out in light, the light can include a peak emission wavelength that can excite at least a portion of the quantum dots. For example, light can include a peak emission wavelength in a range from about 365 nm to about 480 nm. Light can be provided by a light source with peak wavelength at a desired wavelength. Light flux can be in a range from about 10 to about 100 mW/cm$^2$. See also, for example, U.S. Application Nos. 61/377242 of Peter T. Kazlas, et al., entitled "Device Including Quantum Dots", filed 26 Aug. 2010, and 61/377148 of Peter T. Kazlas, et al., entitled "Quantum Dot Light Emitting Device", filed 26 Aug. 2010, each of the foregoing being hereby incorporated herein by reference in its entirety.

Examples of hole transport materials include organic material and inorganic materials. An example of an organic material that can be included in a hole transport layer includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other hole transport layer can include (N,N'-bis(3-methylphenyl)-N,N'-bis(phenyl)-spiro (spiro-TPD), 4,4'-N,N'-dicarbazolyl-biphenyl (CBP), 4,4-.bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, N,N,N',N'-tetraarylbenzidine, poly(3,4-ethylenedioxythiophene) (PEDOT)/polystyrene para-sulfonate (PSS) derivatives, poly-N-vinylcarbazole derivatives, polyphenylenevinylene derivatives, polyparaphenylene derivatives, polymethacrylate derivatives, poly(9,9-octylfluorene) derivatives, poly(spiro-fluorene) derivatives, N,N'-di(naphthalene-1-yl)-N,N'-diphenyl-benzidine (NPB), tris(3-methylphenylphenylamino)-triphenylamine (m-MTDATA), and poly(9,9'-dioctylfluorene-co-N-(4-butylphenyl)diphenylamine (TFB), and spino-NPB.

In certain preferred embodiments, a hole transport layer comprises an organic small molecule material, a polymer, a spiro-compound (e.g., spiro-NPB), etc.

In certain embodiments of the inventions described herein, a hole transport layer can comprise an inorganic material. Examples of inorganic materials include, for example, inorganic semiconductor materials capable of transporting holes. The inorganic material can be amorphous or polycrystalline. Examples of such inorganic materials and other information related to fabrication of inorganic hole transport materials that may be helpful are disclosed in International Application No. PCT/US2006/005184, filed 15 Feb. 2006, for "Light Emitting Device Including Semiconductor Nanocrystals", which published as WO 2006/088877 on 26 Aug. 2006, the disclosure of which is hereby incorporated herein by reference in its entirety.

Hole transport materials comprising, for example, an inorganic material such as an inorganic semiconductor material, can be deposited at a low temperature, for example, by a known method, such as a vacuum vapor deposition method, an ion-plating method, sputtering, inkjet printing, sol-gel, etc.

Organic hole transport materials may be deposited by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., ≤$10^{-8}$ torr), high vacuum (e.g., from about $10^{-8}$ torr to about $10^{-5}$ torr), or low vacuum conditions (e.g., from about $10^{-5}$ torr to about $10^{-3}$ torr).

Hole transport materials comprising organic materials and other information related to fabrication of organic charge transport layers that may be helpful are disclosed in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005, each of which is hereby incorporated herein by reference in its entirety.

The hole transport material is preferably included in the device as a layer. In certain embodiments, the layer can have a thickness in a range from about 10 nm to about 500 nm.

Device 10 can further include a hole-injection material. The hole-injection material may comprise a separate hole injection material or may comprise an upper portion of the hole transport layer that has been doped, preferably p-type doped. The hole-injection material can be inorganic or organic. Examples of organic hole injection materials include, but are not limited to, LG-101 (see, for example, paragraph (0024) of EP 1 843 411 A1) and other HIL materials available from LG Chem, LTD. Other organic hole injection materials can be used. Examples of p-type dopants include, but are not limited to, stable, acceptor-type organic molecular material, which can lead to an increased hole conductivity in the doped layer, in comparison with a non-doped layer. In certain embodiments, a dopant comprising an organic molecular material can have a high molecular mass, such as, for example, at least 300 amu. Examples of dopants include, without limitation, $F_4$-TCNQ, $FeCl_3$, etc. Examples of doped organic materials for use as a hole injection material include, but are not limited to, an evaporated hole transport material comprising, e.g., 4, 4', 4"-tris (diphenylamino)triphenylamine (TDATA) that is doped with tetrafluoro-tetracyano-quinodimethane ($F_4$-TCNQ); p-doped phthalocyanine (e.g., zinc-phthalocyanine (ZnPc) doped with $F_4$-TCNQ (at, for instance, a molar doping ratio of approximately 1:30); N,N'-diphenyl-N,N'-bis(1-naphthyl)-1,1'biphenyl-4,4"diamine (alpha-NPD) doped with $F_4$-TCNQ. See J. Blochwitz, et al., "Interface Electronic Structure Of Organic Semiconductors With Controlled Doping Levels", Organic Electronics 2 (2001) 97-104; R. Schmechel, 48, Internationales Wissenschaftliches Kolloquium, Technische Universtaat Ilmenau, 22-25 Sep. 2003; C. Chan et al., "Contact Potential Difference Measurements Of Doped Organic Molecular Thin Films", J. Vac. Sci. Technol. A 22(4), July/August 2004. The disclosures of the foregoing papers are hereby incorporated herein by reference in their entireties. See also, Examples of p-type doped inorganic hole transport materials are described in U.S. Patent Application No. 60/653,094 entitled "Light Emitting Device Including Semiconductor Nanoctystals", filed 16 Feb. 2005, which is hereby incorporated herein by reference in its entirety. Examples of p-type doped organic hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

As shown in FIG. 1, anode 1 may comprise an electrically conductive metal or its oxide that can easily inject holes. Examples include, but are not limited to, ITO, aluminum, aluminum-doped zinc oxide (AZO), silver, gold, etc. Other suitable anode materials are known and can be readily ascertained by the skilled artisan. The anode material can be deposited using any suitable technique. In certain embodiments, the anode can be patterned.

In certain embodiments, the light-emitting device may be fabricated by sequentially forming the first electrode (e.g., a cathode) 6, the first layer (e.g., comprising an electron transport material) 5, the first interfacial layer 4, the emissive material 3, the second layer (e.g., comprising a hole transport material) 2, and the second electrode (e.g., an anode) 1. In certain embodiments, a second interfacial layer is included between the emissive layer 3 and the second layer 2.

In embodiments of devices described herein that include a first and second interfacial layer, the emissive or active device layer including quantum dots preferably is sufficiently thick to prevent shorting between the two interfacial layers.

In certain embodiments, the surface of a charge transport layer comprising a metal oxide can be treated with ozone to promote adhesion of the layer to be disposed thereon. Other adhesion promotion techniques can be used.

In certain embodiments, the electrode (e.g., anode or cathode) materials and other materials are selected based on the light transparency characteristics thereof so that a device can be prepared that emits light from the top surface thereof. A top emitting device can be advantageous for constructing an active matrix device (e.g., a display). In certain embodiments, the electrode (e.g., anode or cathode) materials and other materials are selected based on light transparency characteristics thereof so that a device can be prepared that emits light from the bottom surface thereof.

As mentioned above, the device can further include a substrate (not shown in the figure). Examples of substrate materials include, without limitation, glass, plastic, insulated metal foil.

In certain embodiments, a device can further include a passivation or other protective layer that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy, Other desiccants or moisture absorptive materials can be used.

In accordance with another aspect of the present invention, there is provided a method for preparing a device described herein. In certain embodiments, the method comprises: forming a first layer over a first electrode (e.g., a cathode); forming an interfacial layer over the first layer, forming a layer comprising quantum dots thereover; and forming a second electrode (e.g., an anode) thereover. In certain embodiments, the method can further include forming a second interfacial layer on the layer comprising quantum dots prior to formation of another device layer. For example, in certain embodiments, the method further includes forming a second layer over the emissive layer. In certain of such embodiments, the method can further include forming a layer comprising a hole injection material over the second layer. Examples of materials that can be included in the method include those described herein.

Other information and techniques described herein and incorporated by reference can also be useful in practicing a method in accordance with the present invention.

In certain embodiments, the method can be used to prepare a light emitting device including a pair of electrodes, a layer comprising a light emissive material comprising quantum dots provided between the electrodes, a first layer comprising a material capable of transporting electrons comprising an inorganic material provided between the emissive layer and one of the electrodes, wherein the layer comprising the material capable of transporting electrons comprising an inorganic material comprises a stratified structure including two or more horizontal zones having different conductivities, and a first interfacial layer between the emissive layer and the first layer comprising the material capable of transporting electrons. The inorganic material included in different zones of the stratified structure can be doped or undoped forms of the same or different materials.

In certain embodiments, the inorganic material comprises an inorganic semiconductor material. For example, if a first zone comprises an intrinsic inorganic semiconductor material, a second zone, adjacent thereto, can comprise a doped inorganic semiconductor material; if a first zone comprises an n-type doped inorganic semiconductor material, a second zone, adjacent thereto, can comprise a slightly lower n-type doped or intrinsic inorganic semiconductor material. In certain embodiments, the inorganic semiconductor material that is doped can be a doped form of an intrinsic material included in another zone of the stratified structure. While these examples describe a stratified structure including two zones, a stratified structure can include more than two zones. The inorganic semiconductor material included in different zones of the stratified structure can be doped or undoped forms of the same or different materials.

In certain embodiments, the layer comprising a stratified structure can serve as a layer capable of transporting and injecting electrons. In certain embodiments, a zone in a layer comprising a stratified structure can have a predetermined conductivity so as to serve as a layer capable of transporting electrons, a layer capable of injecting electrons, and/or a layer capable of blocking holes. In certain embodiments, a zone can comprise a distinct layer.

In certain embodiments, the inorganic material comprises a metal chalcogenide. In certain embodiments, the inorganic material comprises a metal sulfide. In certain preferred embodiments, the inorganic material comprises a metal oxide. In certain embodiments, the inorganic material comprises titanium dioxide. In certain more preferred embodiments, the inorganic material comprises zinc oxide. In certain embodiments, the inorganic material comprises a mixture of two or more inorganic materials. Other examples of inorganic semiconductor materials that can be used include those described elsewhere herein.

In certain embodiments, a layer comprising an inorganic semiconductor material that includes a stratified structure as taught herein can serve as a layer capable of transporting electrons, injecting electrons, and/or blocking holes.

Examples of materials useful for the anode and cathode include those described elsewhere herein.

Quantum dots included in the emissive layer can include those described elsewhere herein.

Examples of interfacial layers include those described elsewhere herein. Optionally, a second interfacial layer can be included on the side of the emissive layer opposite the first interfacial layer. Preferably, the first and second interfacial layer are distinct layers.

In certain embodiments, different conductivities can be accomplished, for example, by changing the carrier mobility and/or charge density of the material.

In certain embodiments including an inorganic material comprising a metal oxide, for example, conduction properties of layers comprising a metal oxide are highly dependent on the concentration of oxygen in the layer structure since vacancies are the main mode of carrier conduction. For example, in certain embodiments, to control the oxygen concentration in sputter deposited layers (e.g., made by magnetron RF sputter deposition) two properties of the deposition can be altered. The power of deposition can be varied, increasing and decreasing the amount of oxygen that is incorporated in the layer. The powers and resulting conductivities are highly dependent on the material and the sputter system used. More oxygen can also be incorporated into the layer by adding oxygen to the sputter chamber gas environment which is often dominated by noble gases like Argon. Both the power and oxygen partial pressure can be used or customized to produce the desired layered metal oxide structure. Lowering the RF power during deposition can increase the conductivity of the layer, reducing the parasitic resistance of the layer. To deposit a low conductivity layer, oxygen is incorporated into the deposition ambient to place a thin insulating surface on the layer formed.

Other information and techniques described herein and incorporated by reference can also be useful with this aspect of the present invention.

In certain embodiments of the present invention, there is provided a light emitting device taught herein, wherein light emission from the light emissive material occurs at a bias voltage across the device that is less than the energy in electron-Volts of the bandgap of the emissive material. In certain embodiments, the light emitting device includes an emissive material comprising quantum dots.

In certain embodiments of the present invention, there is provided a light emitting device taught herein, wherein the device has an initial turn-on voltage that is not greater than $1240/\lambda$, wherein $\lambda$ represents the wavelength (nm) of light emitted by the emissive layer.

A light-emitting device in accordance with the invention can be used to make a light-emitting device including red-emitting, green-emitting, and/or blue-emitting quantum dots. Other color light-emitting quantum dots can be included, alone or in combination with one or more other different quantum dots. In certain embodiments, separate layers of one or more different quantum dots may be desirable. In certain embodiments, a layer can include a mixture of two or more different quantum dots.

Light-emitting devices in accordance with various embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

In certain embodiments, a device taught herein can comprise a photodetector device including a layer comprising quantum dots selected based upon absorption properties. The layer comprising quantum dots is included between a pair of electrodes and an interfacial layer is disposed on at least one surface of the quantum dot containing layer. When included in a photodetector, quantum dots are engineered to produce a predetermined electrical response upon absorption of a particular wavelength, typically in the IR or MIR region of the spectrum. Examples of photodetector devices including quantum dots (e.g., semiconductor nanocrystals) are described in "A Quantum Dot Heterojunction Photodetector" by Alexi Cosmos Arango, Submitted to the Department of Electrical Engineering and Computer Science, in partial fulfillment of the requirements for the degree of Masters of Science in Computer Science and Engineering at the Massachusetts Institute of Technology, February 2005, the disclosure of which is hereby incorporated herein by reference in its entirety.

Other materials, techniques, methods, applications, and information that may be useful with the present invention are described in: International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2007/003411, filed Feb. 8, 2007, of Beatty, et al., for "Device Including Semiconductor Nanocrystals And A Layer Including A Doped Organic Material And Methods"; International Application No. PCT/US2007/008721, filed Apr. 9, 2007, of Cox, et al., for "Methods Of Depositing Nanomaterial & Methods Of Making A Device"; International Application No. PCT/US2007/24320, filed Nov. 21, 2007, of Clough, et al., for "Nanocrystals Including A Group IIIa Element And A Group Va Element, Method, Composition, Device And Other Products"; International Application No. PCT/US2007/24305, filed Nov. 21, 2007, of Breen, et al., for "Blue Light Emitting Semiconductor Nanocrystal And Compositions And Devices Including Same"; International Application No. PCT/US2007/013152, filed Jun. 4, 2007, of Coe-Sullivan, et al., for "Light Emitting Devices And Displays With Improved Performance"; International Application No. PCT/US2007/24310, filed Nov. 21, 2007, of Kazias, et al., for "Light-Emitting Devices And Displays With Improved Performance"; International Application No. PCT/US2007/003677, filed Feb. 14, 2007, of Bulovic, et al., for "Solid State Lighting Devices Including Semiconductor Nanocrystals & Methods", U.S. Patent Application No. 61/016227, filed 21 Dec. 2007, of Coe-Sullivan et al., for "Compositions, Optical Component, System Including an Optical Component, and Devices", U.S. Patent Application No. 60/949306, filed 12 Jul. 2007, of Linton, et al., for "Compositions, Methods For Depositing Nanomaterial, Methods For Fabricating A Device, And Methods For Fabricating An Array Of Devices", U.S. Patent Application No. 60/992598, filed 5 Dec. 2007, and International Application No. PCT/US2009/002123, of Zhou, et al. for "Light Emitting Device Including Quantum Dots", filed 3 Apr. 2009. The disclosures of each of the foregoing listed patent documents are hereby incorporated herein by reference in their entireties.

As used herein, the singular forms "a", "an" and "the" include plural unless the context clearly dictates otherwise. Thus, for example, reference to an emissive material includes reference to one or more of such materials.

As used herein, "top" and "bottom" are relative positional terms, based upon a location from a reference point. More particularly, "top" means furthest away from the substrate, while "bottom" means closest to the substrate. For example, for a light-emitting device including two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface further away from the substrate. Where, e.g., a first layer is described as disposed or deposited "over" a second layer, the first layer is disposed further away from substrate. There may be layers between the first and second layer, unless it is otherwise specified. For example, a cathode may be described as "disposed over" an anode, even though there are various organic and/or inorganic layers in between.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A light emitting device including a first electrode and a second electrode, an emissive layer comprising quantum dots disposed between the first and second electrodes, a first layer comprising a first charge transport material comprising an inorganic material disposed between the first electrode and the emissive layer, and a first interfacial layer disposed between the emissive layer and the first layer, wherein the first interfacial layer protects quantum dots from charge quenching sites in a contiguous device layer and is a distinct layer, the first interfacial layer comprising a material that is non-quenching to quantum dot photoluminescent emission and does not impede charge flow, wherein the inorganic material comprises a metal chalcogenide, and wherein the first interfacial layer has a thickness in a range from a monolayer thickness to about 5 nm.

2. A light emitting device in accordance with claim 1 wherein the device further includes a second layer comprising a second charge transport material between the emissive layer and the second electrode.

3. A light emitting device in accordance with claim 1 wherein the inorganic material comprises a metal oxide.

4. A light emitting device in accordance with claim 1 wherein the inorganic material comprises a zinc oxide.

5. A light emitting device in accordance with claim 1 wherein the inorganic material comprises a metal sulfide.

6. A light emitting device in accordance with claim 1 wherein the inorganic material comprises a mixture of two or more inorganic materials.

7. A light emitting device in accordance with claim 1 wherein the thickness of the first interfacial layer is effective to reduce quenching of quantum dot emission due to interaction of the quantum dots in the emissive layer with the first layer comprising a first charge transport material.

8. A light emitting device in accordance with claim 1 wherein the first interfacial layer comprises an inorganic material.

9. A light emitting device in accordance with claim 1 wherein the first interfacial layer comprises an organic material.

10. A light emitting device in accordance with claim 1 wherein the first interfacial layer fills voids that may exist between quantum dots.

11. A light emitting device in accordance with claim 1 wherein the first interfacial layer comprises a surfactant.

12. A light emitting device in accordance with claim 1 wherein the first interfacial layer comprises a silicon-containing coupling agent.

13. A light emitting device in accordance with claim 1 wherein the first interfacial layer comprises a metal oxide.

14. A light emitting device in accordance with claim 1 wherein the first interfacial layer comprises an organic small molecule material.

15. A light emitting device in accordance with claim 1 wherein the first interfacial layer comprises a material non-quenching to quantum dot emission.

16. A light emitting device in accordance with claim 1 wherein the first interfacial layer comprises a material that is non-crystallizing.

17. A light emitting device in accordance with claim 1 wherein the first interfacial layer comprises material with a glass transition temperature (Tg) greater than 150° C.

18. A light emitting device in accordance with claim 1 wherein the first interfacial layer comprises a spiro compound.

19. A light emitting device in accordance with claim 1 wherein the first interfacial layer comprises non-light-emitting nanoparticles having a bandgap that is the same or similar to the bandgap of quantum dots included in the layer comprising quantum dots.

20. A light emitting device in accordance with claim 1 wherein the first interfacial layer comprises non-light-emitting nanoparticles having a bandgap that is higher than the bandgap of quantum dots included in the layer comprising quantum dots.

21. A light emitting device in accordance with claim 1 wherein the first interfacial layer comprises non-light-emitting semiconductor nanoparticles that have been chemically treated to give them intrinsic semiconductor properties.

22. A light emitting device in accordance with claim 1 wherein the first interfacial layer comprises non-light-emitting semiconductor nanoparticles that have been chemically treated to give them n-type (electron transporting) semiconductor properties.

23. A light emitting device in accordance with claim 1 wherein the first interfacial layer comprises non-light-emitting semiconductor nanoparticles that have been chemically treated to give them p-type (hole transporting) semiconductor properties.

24. A light emitting device in accordance with claim 1 wherein the first interfacial layer comprises non-light-emitting nanoparticles that have been chemically treated to include a chemical linker capable of attaching to the layer comprising quantum dots.

25. A light emitting device in accordance with claim 1 wherein the first interfacial layer comprises organic small molecules having a dipole moment that modifies the work function of the first layer.

26. A light emitting device in accordance with claim 1 wherein the first interfacial layer comprises organic small molecules that chemically stabilizes the surface of the first layer.

27. A light emitting device in accordance with claim 1 wherein the first interfacial layer comprises an inorganic material that chemically stabilizes the surface of the first layer.

28. A light emitting device in accordance with claim 1 wherein the first interfacial layer comprises an adhesion promoting moiety.

29. A light emitting device in accordance with claim 1 wherein the first interfacial layer comprises a bipolar transport material.

30. A light emitting device in accordance with claim 1 wherein the quantum dots comprise semiconductor nanocrystals.

31. A light emitting device in accordance with claim 1 wherein the emissive layer includes two or more different types of quantum dots, wherein each type is selected to emit light having a predetermined distinct color.

32. A light emitting device in accordance with claim 1 wherein the first electrode is a cathode, the second electrode is an anode, and the first charge transport material comprises a material that transports electrons.

33. A light emitting device in accordance with claim 1 wherein the first electrode is an anode, the second electrode is cathode, and the first charge transport material comprises a material that transports holes.

34. A light emitting device in accordance with claim 2 wherein the device further includes a second interfacial layer between the emissive layer and the second layer comprising a second charge transport material in the device, wherein the second interfacial layer protects quantum dots from charge quenching sites in another device layer, wherein the second interfacial layer has a thickness in a range from a monolayer thickness to about 5 nm.

35. A light emitting device in accordance with claim 2 wherein the first electrode is an anode, the first charge transport material comprises a material that transports holes, the second charge transport material comprises a material that transports electrons, and the second electrode is a cathode.

36. A light emitting device in accordance with claim 7 wherein the thickness of the first interfacial layer further is less than a thickness that would reduce charge transfer or tunneling between the emissive layer and the first layer.

37. A light emitting device in accordance with claim 34 wherein the thickness of the second interfacial layer is effective to reduce quenching of quantum dot emission due to interaction of the quantum dots in the emissive layer with the second layer comprising a second charge transport material.

38. A light emitting device in accordance with claim 34 wherein the thickness of the second interfacial layer further is less than a thickness that would reduce charge transfer or tunneling between the emissive layer and the second layer.

39. A light emitting device in accordance with claim 34 wherein the second interfacial layer comprises a material non-quenching to quantum dot emission.

40. A light emitting device in accordance with claim 2 wherein the first electrode is a cathode, the first charge transport material comprises a material that transports electrons, the second charge transport material comprises a material that transports holes, and the second electrode is an anode.

41. A light emitting device including a first electrode and a second electrode, an emissive layer comprising quantum dots disposed between the first and second electrodes, a first layer comprising a first charge transport material comprising an inorganic material disposed between the first electrode and the emissive layer, and a first interfacial layer disposed between the emissive layer and the first layer, wherein the first interfacial layer protects quantum dots from charge quenching sites in a contiguous device layer and is a distinct layer, the first interfacial layer comprising a material that is non-quenching to quantum dot photoluminescent emission and does not impede charge flow, wherein the first interfacial layer comprises a metal oxide including an alkali metal or alkaline earth metal dopant.

* * * * *